(12) United States Patent
Ban

(10) Patent No.: US 8,201,063 B2
(45) Date of Patent: Jun. 12, 2012

(54) TRANSMITTER AND RECEIVER

(75) Inventor: Koichiro Ban, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1148 days.

(21) Appl. No.: 12/034,812

(22) Filed: Feb. 21, 2008

(65) Prior Publication Data

US 2008/0222482 A1    Sep. 11, 2008

(30) Foreign Application Priority Data

Mar. 8, 2007 (JP) .................................. 2007-58637

(51) Int. Cl.
*H03M 13/03* (2006.01)

(52) U.S. Cl. ....................................................... 714/790

(58) Field of Classification Search .................... 714/790
See application file for complete search history.

(56) References Cited

U.S. PATENT DOCUMENTS

| 6,952,394 | B1 * | 10/2005 | Kim et al. ...................... 370/208 |
| 2005/0122914 | A1 * | 6/2005 | Durso et al. ................... 370/270 |
| 2006/0176966 | A1 | 8/2006 | Stewart et al. | |
| 2006/0262714 | A1 * | 11/2006 | Tarokh et al. ................. 370/208 |

FOREIGN PATENT DOCUMENTS

| JP | 2004040232 | 2/2004 |
| JP | 2006-222956 | 8/2006 |
| WO | 2005109710 | 11/2005 |

OTHER PUBLICATIONS

Japanese Office Action mailed on Dec. 5, 2008 corresponding to U.S. Appl. No. 12/034,812, filed Feb. 21, 2008.

* cited by examiner

*Primary Examiner* — Guy Lamarre
(74) *Attorney, Agent, or Firm* — Turocy & Watson, LLP

(57) ABSTRACT

There is provided with a transmitter including: an input unit configured to input a data symbol sequence; a block generator configured to sequentially generate data blocks each including a plurality of data symbols by using the data symbol sequence; an addition unit configured to add a duplicate of h data symbols at an end of a first data block to a head of the first data block as a cyclic prefix to obtain a first data block with the cyclic prefix; and a transmission unit configured to transmit the first data block with the cyclic prefix, wherein the block generator uses, as k data symbols that precede the h data symbols at the end of the first data block, a duplicate of k data symbols at an end of a second data block that precedes the first data block.

22 Claims, 21 Drawing Sheets

TRANSMITTER AND RECEIVER

CROSS REFERENCE TO RELATED APPLICATIONS

This application is based upon and claims the benefit of priority from the prior Japanese Patent Applications No. 2007-58637, filed on Mar. 8, 2007; the entire contents of which are incorporated herein by reference.

BACKGROUND OF THE INVENTION

1. Field of the Invention

The present invention relates to a transmitter and a receiver, for example, a transmitter and a receiver which carry out single carrier communication using a cyclic prefix.

2. Related Art

Examples of conventional methods for extending a cyclic prefix (CP) length include a method of fixing a data block size and increasing the number of symbols added to the head of the data block as a cyclic prefix (first conventional extension method) and a method of fixing a total size of a cyclic prefix and data block size and reducing the data block size by an amount corresponding to the increase in the number of cyclic prefix symbols (second conventional extension method). JP-A 2006-222956 (Kokai) is one such related Patent Document.

However, according to the first conventional extension method, an extension of the cyclic prefix length (CP length) causes the total size of the cyclic prefix and data block size to increase, resulting in a problem that the timing of FFT processing at the receiver changes. The second conventional extension method causes the data block size to diminish, resulting in a problem that the FFT size at the receiver changes.

SUMMARY OF THE INVENTION

According to an aspect of the present invention, there is provided with a transmitter comprising:

an input unit configured to input a data symbol sequence;

a block generator configured to sequentially generate data blocks each including a plurality of data symbols by using the data symbol sequence;

an addition unit configured to add a duplicate of h (h is an integer equal to or more than 1) data symbols at an end of a first data block to a head of the first data block as a cyclic prefix to obtain a first data block with the cyclic prefix; and a transmission unit configured to transmit the first data block with the cyclic prefix, wherein the block generator uses, as k (k is an integer equal to or more than 1) data symbols that precede the h data symbols at the end of the first data block, a duplicate of k data symbols at an end of a second data block that precedes the first data block.

According to an aspect of the present invention, there is provided with a transmitter comprising:

an input unit configured to input a data symbol sequence;

a block generator configured to sequentially generate data blocks each including a plurality of data symbols by using the data symbol sequence;

an addition unit configured to add a duplicate of h (h is an integer equal to or more than 1) data symbols at a head of a first data block to an end of the first data block as a cyclic postfix to obtain a first data block with the cyclic postfix; and a transmission unit configured to transmit the first data block with the cyclic postfix, wherein the block generator uses, as k (k is an integer equal to or more than 1) data symbols at the end of the first data block, a duplicate of k data symbols from an end of h data symbols at a head of second data block that precedes the first data block toward the head.

According to an aspect of the present invention, there is provided with a transmitter comprising:

an input unit configured to input a data symbol sequence;

a block generator configured to sequentially generate data blocks each including a plurality of data symbols by using the data symbol sequence;

an addition unit configured to add a duplicate of h (h is an integer equal to or more than 1) data symbols at an end of a first data block to a head of the first data block as a cyclic prefix to obtain a first data block with the cyclic prefix; and a transmission unit configured to transmit the first data block with the cyclic prefix, wherein the block generator uses, as k (k is an integer equal to or more than 1) data symbols at the end of the first data block, a duplicate of k data symbols that precede h data symbols at an end of in a third data block that follows the first data block.

According to an aspect of the present invention, there is provided with a transmitter comprising:

an input unit configured to input a data symbol sequence;

a block generator configured to sequentially generate data blocks each including a plurality of data symbols by using the data symbol sequence;

an addition unit configured to add a duplicate of h (h is an integer equal to or more than 1) data symbols at a head of a first data block to an end of the first data block as a cyclic postfix to obtain a first data block with the cyclic postfix; and a transmission unit configured to transmit the first data block with the cyclic postfix, wherein the block generator uses, as k (k is an integer equal to or more than 1) data symbols from the end of the h data symbols at the head of the first data block toward the head, a duplicate of k data symbols at an end of a third data block that follows the first data block.

According to an aspect of the present invention, there is provided with a receiver comprising:

a reception unit configured to sequentially receive data blocks with cyclic prefixes or cyclic postfixes, the data blocks each including a plurality of data symbols;

a removing unit configured to remove the cyclic prefix or cyclic postfix from a first data block with the cyclic prefix or cyclic postfix and thereby extract the first data block;

an FFT processing unit configured to perform a fast Fourier transform (FFT) on the first data block to decompose the first data block into a plurality of frequency components;

an equalization processing unit configured to perform equalization processing on signals of the plurality of frequency components;

an IFFT processing unit configured to perform IFFT (Inverse Fast Fourier Transform) processing on the signals of the plurality of frequency components subjected to the equalization processing to obtain a first received data block including a plurality of received data symbols; and a combining unit configured to combine a first received data symbol at a first position specified beforehand in the first received data block and a second received data symbol at a second position specified beforehand in a second received data block obtained following or preceding the first received data block to obtain a combined symbol to be used instead of the first received data symbol.

According to an aspect of the present invention, there is provided with a receiver comprising:

a reception unit configured to sequentially receive data blocks with cyclic prefixes or cyclic postfixes, the data blocks each including a plurality of data symbols;

a removing unit configured to remove the cyclic prefix or cyclic postfix from a first data block with the cyclic prefix or cyclic postfix and thereby extract the first data block;

an FFT processing unit configured to perform a fast Fourier transform (FFT) on the first data block to decompose the first data block into a plurality of frequency components;

an equalization processing unit configured to perform equalization processing on the signals of the plurality of frequency components;

an IFFT processing unit configured to perform IFFT processing on the signals of the plurality of frequency components subjected to the equalization processing to obtain a first received data block including a plurality of received data symbols;

a bit likelihood generator configured to generate bit likelihood data from each received data symbol in the first received data block; and a combining unit configured to combine
- first bit likelihood data generated from a received data symbol at a third position specified beforehand in the first received data block and
- second bit likelihood data generated from a received data symbol at a fourth position specified beforehand in a second received data block obtained following or preceding the first received data block and
- thereby generate third bit likelihood data to be used instead of the first bit likelihood data.

DETAILED DESCRIPTION OF THE INVENTION

Figure 17:
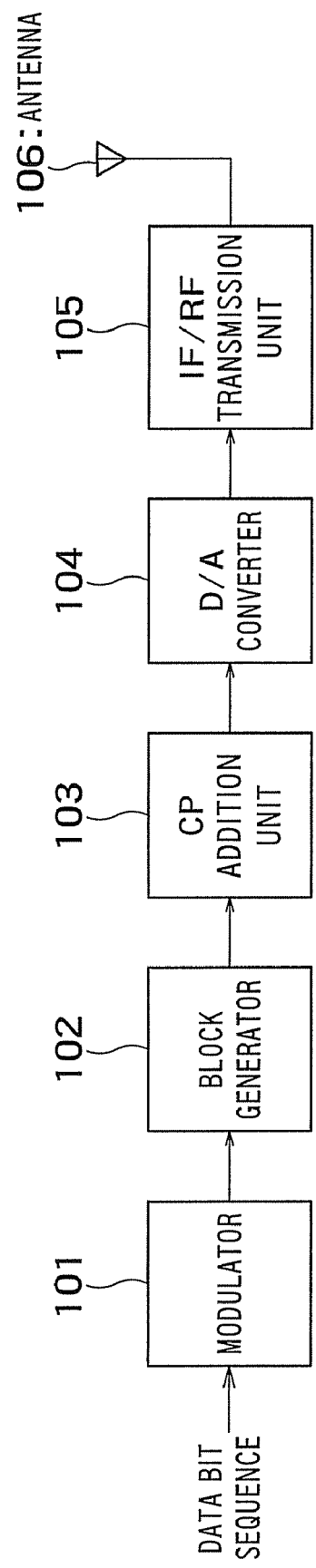
FIG. 17 shows a configuration example of a conventional single carrier transmitter.

FIG. 17 shows a configuration example of a conventional single carrier transmitter when the length of a cyclic prefix (CP) is fixed.

A modulator 101 applies data modulation such as QPSK modulation or QAM modulation to a data bit sequence which becomes transmission data and converts it to a data symbol sequence.

Figure 18:
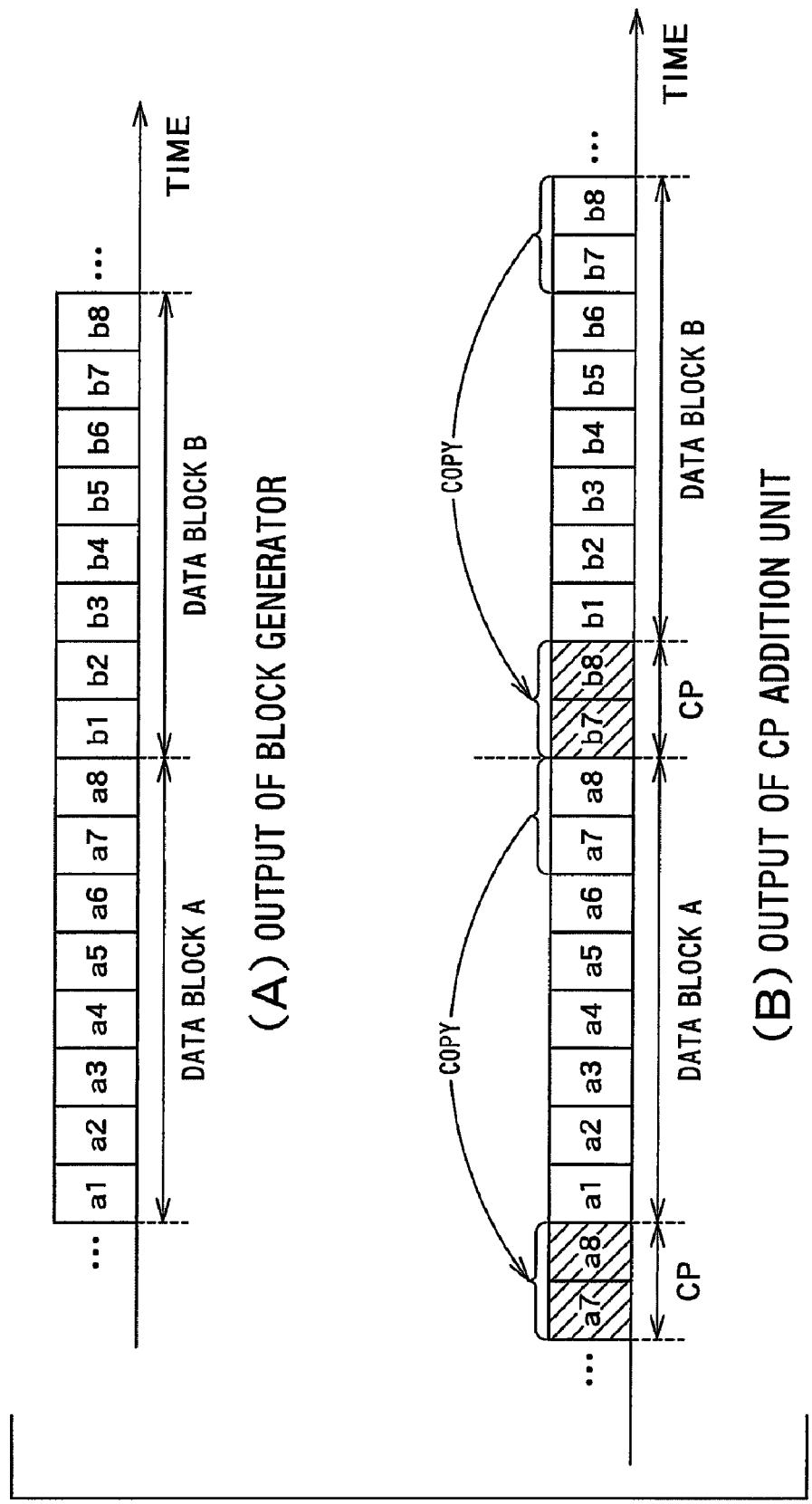
FIG. 18 illustrates the operation of a block generator and a CP addition unit of the conventional single carrier transmitter.

A block generator 102 generates one data block from a plurality of data symbols outputted from the data modulator 101 and outputs the data block. FIG. 18(A) shows an example where one data block is generated from 8 data symbols. A data block A is composed of eight data symbols a1, a2, a3, a4, a5, a6, a7, a8 and a data block B is composed of eight data symbols b1, b2, b3, b4, b5, b6, b7, b8. These two data blocks A, B are outputted from the block generator 102 in this order. Here, the number of data symbols included in the data block is defined as a data block size and the time length of the data block is defined as the data block length. For example, the data block size of the data block A is 8.

For the data block inputted from the block generator 102, a CP addition unit 103 adds a copy (duplicate) of one or more data symbols at the end in the data block to the head of the data block as a cyclic prefix. FIG. 18(B) shows a situation in which cyclic prefixes are added to the data blocks A, B. For example, for the data block A, the last two symbols (a7, a8) of the data block A are copied (duplicated) and added to the head of data block A as a cyclic prefix. Here, the number of data symbols included in a cyclic prefix is defined as a CP size and the time length of the cyclic prefix is defined as a CP length. For example, the CP size is 2 in the example in FIG. 18(B).

The data block to which cyclic prefix have been added is converted to an analog signal by a D/A converter 104 and transmitted from an antenna 106 via an IF (Intermediate Frequency)/RF (Radio Frequency) transmission unit 105.

Figure 19:
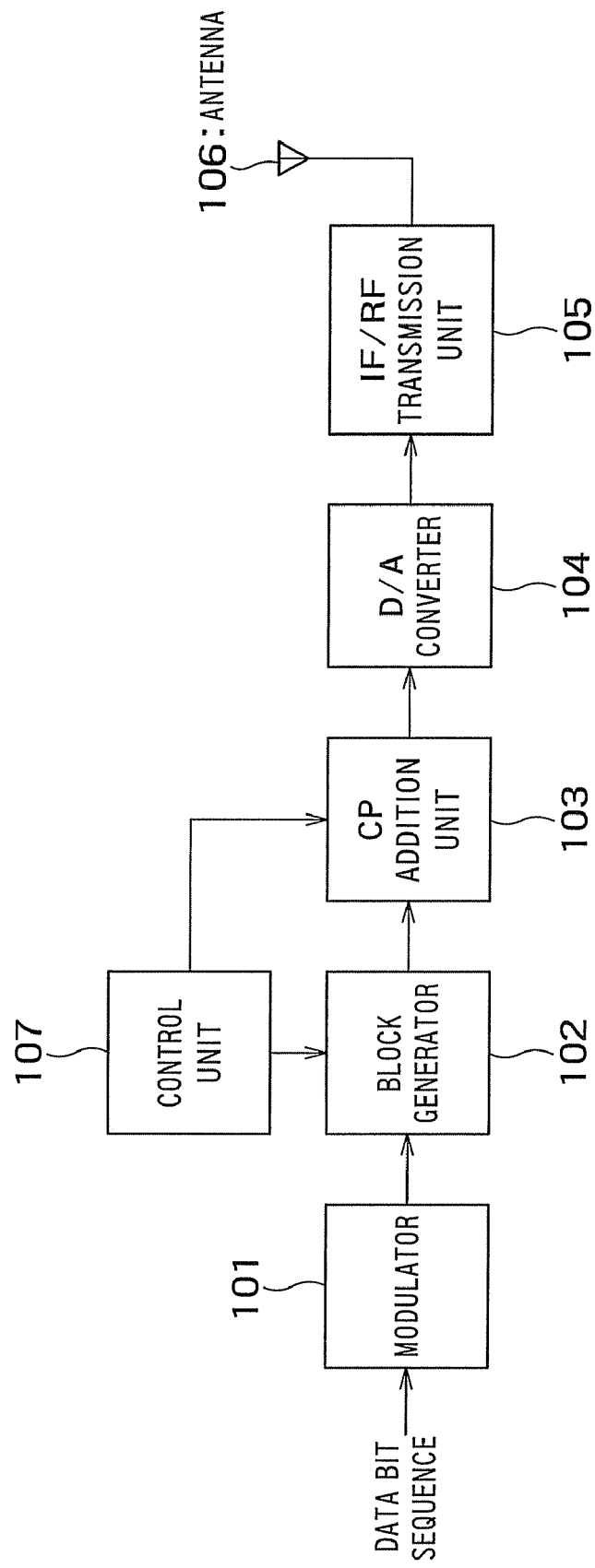
FIG. 19 is a configuration example of a conventional single carrier transmitter capable of executing a conventional first and second extension method.

FIG. 19 shows a configuration example of a conventional single carrier transmitter when extending a cyclic prefix length (CP length) using the conventional first and second extension methods described in the section of the background art. A difference thereof from the conventional transmitter shown in FIG. 17 in the case where the CP length is fixed lies in that a control unit 107 can change the size of a data block outputted from a block generator 102 and the size of a CP added by a CP addition unit 103. In the figure, elements having the same names as those in FIG. 17 are assigned the same reference numerals.

Figure 20:
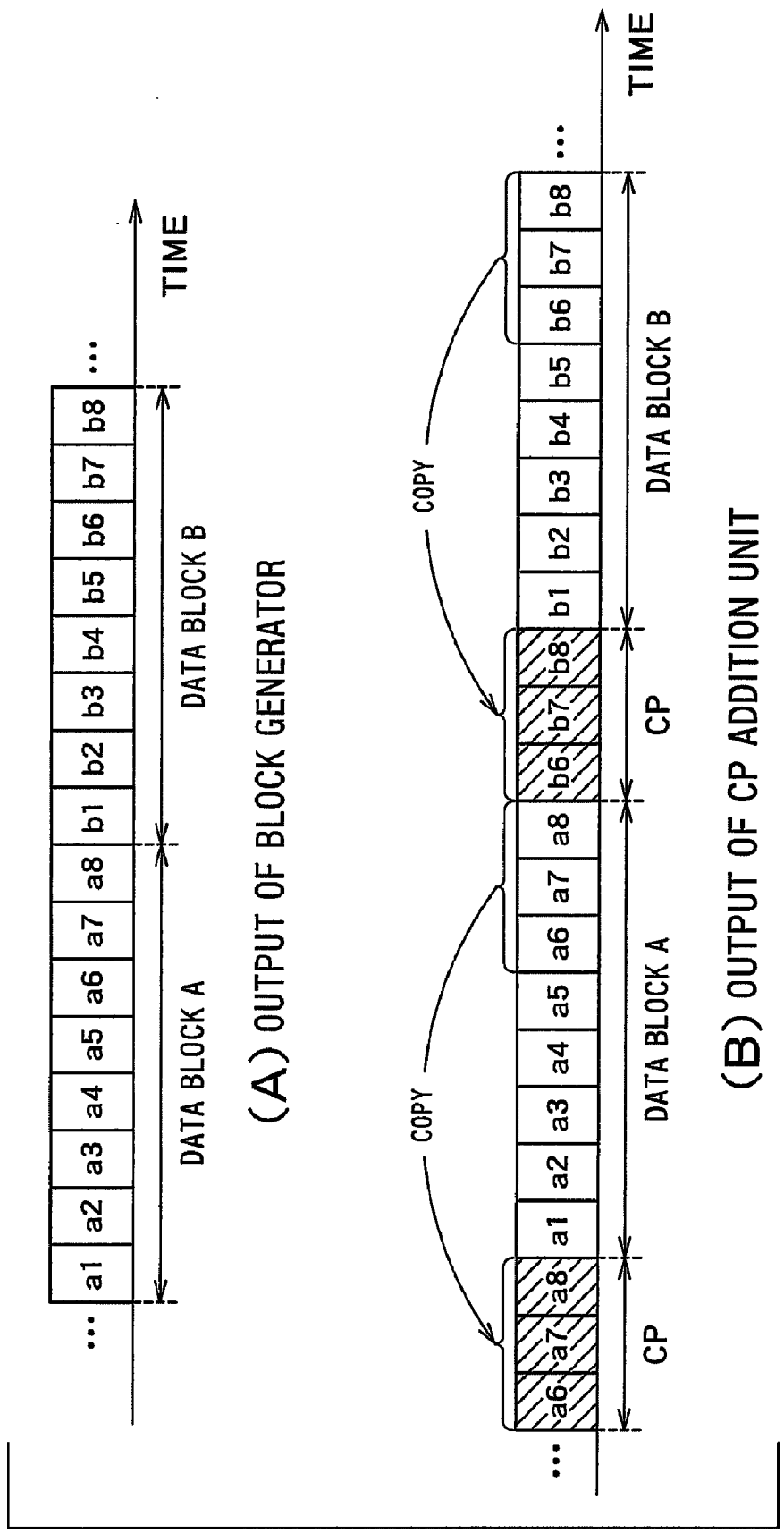
FIG. 20 shows the output of the block generator and the output of the CP addition unit when executing a conventional first extension method.

FIG. 20(A) and FIG. 20(B) show the output of the block generator 102 and the output of the CP addition unit 103 when the CP size is changed from 2 to 3 using the above described first conventional extension method.

The data block size remains 8, yet the CP size is extended from 2 to 3. Therefore, the total size of the CP size plus the data block size is larger than that before extending the CP size. This causes a problem that FFT timing for demodulating consecutive data blocks at a receiver changes compared to that before extending the CP size.

Figure 21:
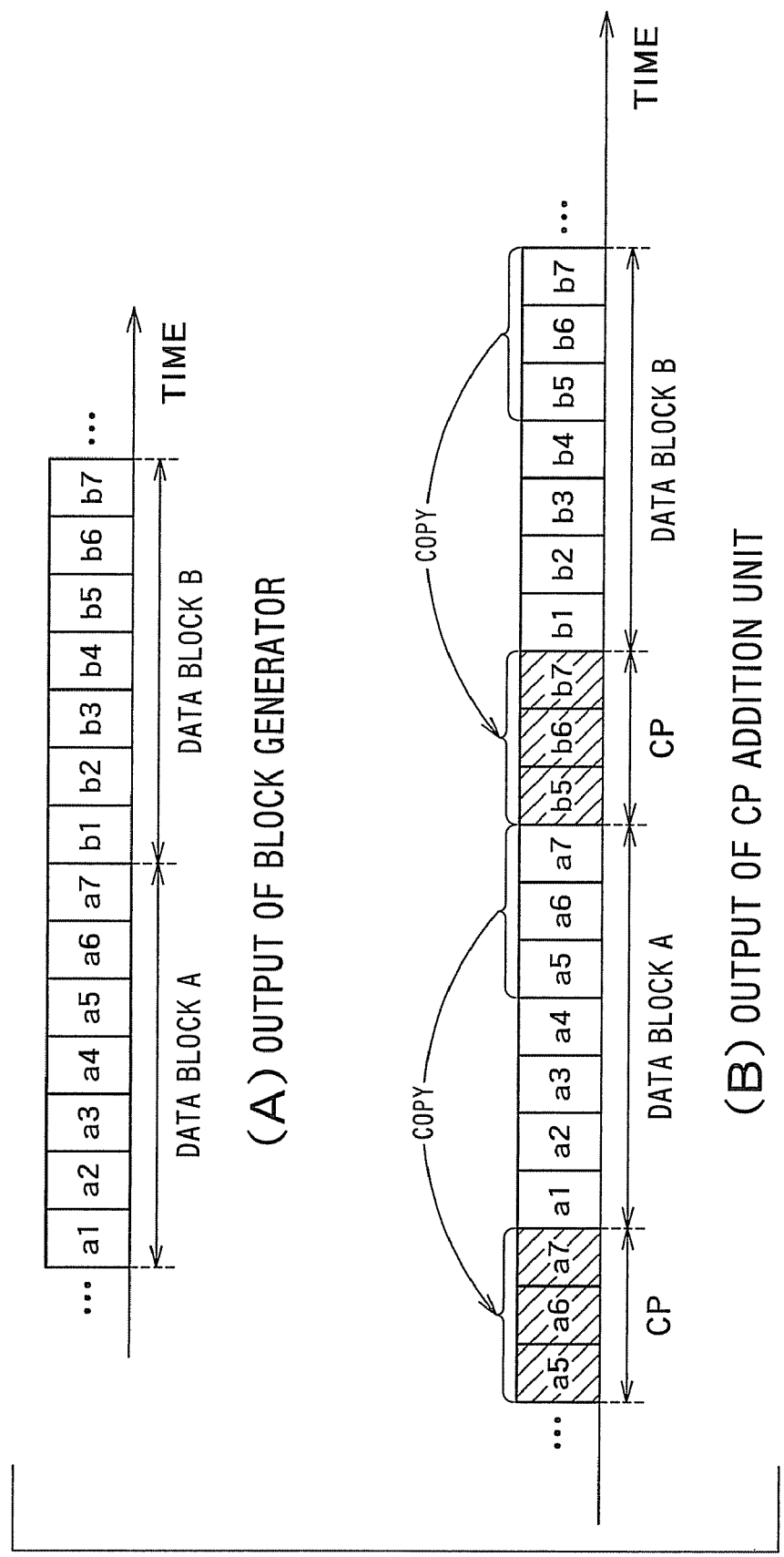
FIG. 21 shows the output of the block generator and the output of the CP addition unit when executing a conventional second extension method.

FIG. 21 shows the output of the block generator 102 and the output of the CP addition unit 103 when the CP size is extended from 2 to 3 using the above described second conventional extension method.

The data block size is reduced to 7 and the CP size is extended from 2 to 3. In this case, while the total size of the CP size plus the data block size remains the same, since the data block size is reduced, there is a problem that an FFT size for demodulating data blocks at the receiver becomes smaller than that before extending the CP size.

Therefore, when the cyclic prefix length is extended using any one of the conventional first and second extension methods, interference occurs among signals when the receiver collectively performs FFT (Fast Fourier Transform) processing on a plurality of frequency multiplexed single carrier signals or a single carrier signal and an OFDM (Orthogonal Frequency Division Multiplexing) signal.

An embodiment of the present invention makes it possible to substantially change a cyclic prefix length in data block units while fixing a data block size and a CP size. When the receiver collectively performs FFT processing on a plurality of frequency multiplexed single carrier signals or a single carrier signal and an OFDM signal, it is thereby possible to obtain the same effect as extending the CP size while preventing the occurrence of interference among signals.

Hereinafter, embodiments of the present invention will be explained in detail with reference to drawings.

Figure 1:
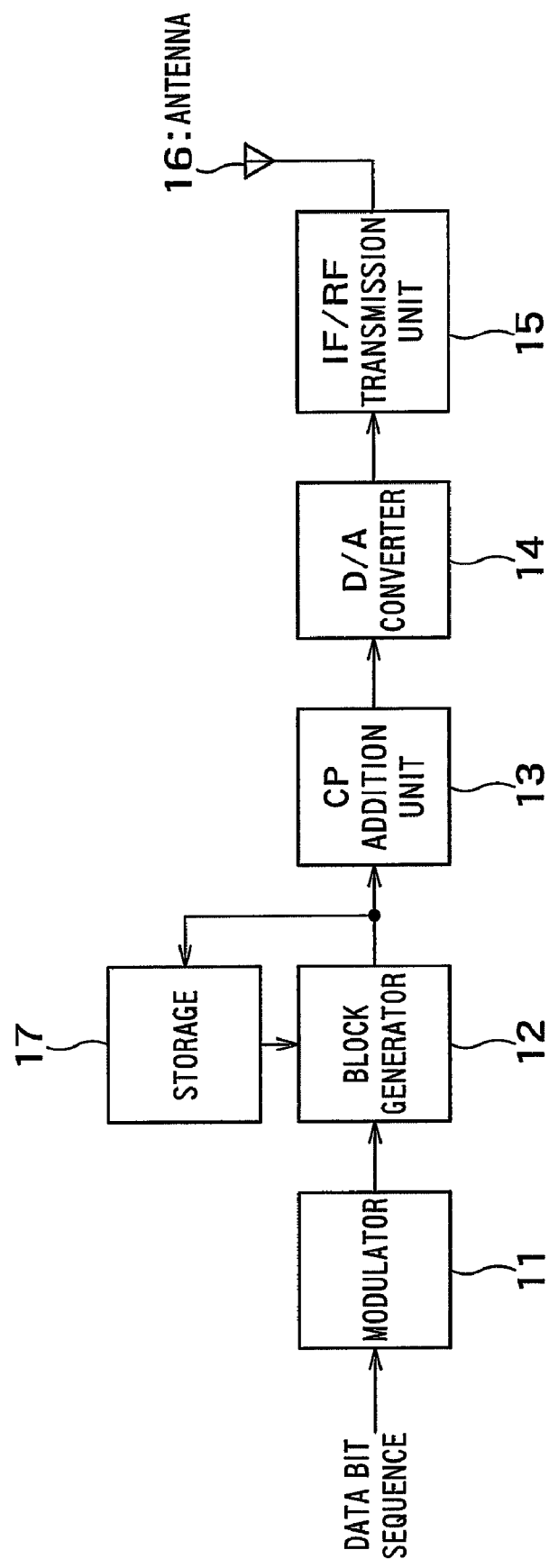
FIG. 1 shows a first embodiment of a single carrier transmitter of the present invention.

FIG. 1 shows a first embodiment of a single carrier transmitter of the present invention.

The data bit sequence which becomes transmission data is subjected to data modulation such as QPSK modulation or QAM modulation at a modulator 11 and converted to a data symbol sequence and inputted to a block generator 12. The modulator 11 has an input unit which inputs a data symbol sequence to the block generator 12.

The block generator 12 generates a data block from the data symbol inputted from the modulator 11 and a specific data symbol included in a past data block saved in a storage 17. The data block generated is inputted to the storage 17 and a CP addition unit 13.

The storage 17 saves the data block inputted from the data block generator 12.

The CP addition unit 13 copies (duplicates) h (h is an integer equal to or more than 1) data symbols at the end of the data block inputted from the block generator 12 to the head of the data block as a cyclic prefix (i.e. the duplicate of one or more data symbols at the end of the data block is added to the head of the data block as a cyclic prefix).

The data block with the cyclic prefix added thereto is converted to an analog signal by a D/A converter 14 and transmitted from an antenna 16 via an IF/RF transmission unit 15.

Hereinafter, an operation of the block generator 12 will be explained in detail.

When the CP size added by the CP addition unit 13 is Nc symbols, suppose the CP size of a certain data block (e.g., data block B) is desired to be substantially extended by Ne symbols. In this case, the block generator 12 uses a copy (duplicate) of Ne symbols from the end of the data block (e.g., data block A) that precedes the data block B saved in the storage 17 as Ne symbols from (Nc+1)th to (Nc+Ne)th symbols counted from the end of the data block B. As other data symbols of the data block B, data symbols outputted from the modulator 11 are used as usual. The CP addition unit 13 that follows the block generator 12 adds cyclic prefix to the data block B generated in this way as usual and in this way, the end of the immediately preceding data block (e.g., data block A) plays the role as if a part of the cyclic prefix of the data block B and this means that the CP length for the data block B has been substantially extended.

Suppose substantially extending (changing) a CP length by generating a data block using the above described method will be referred to as substantially extending (substantially changing) a cyclic prefix or substantially extending (substantially changing) a CP size (CP length). Moreover, to clarify the points of the discussion, the present invention will be explained assuming that the symbol rate is fixed, and therefore substantially extending the CP length will be treated as a synonym of substantially extending the CP size.

Figure 2:
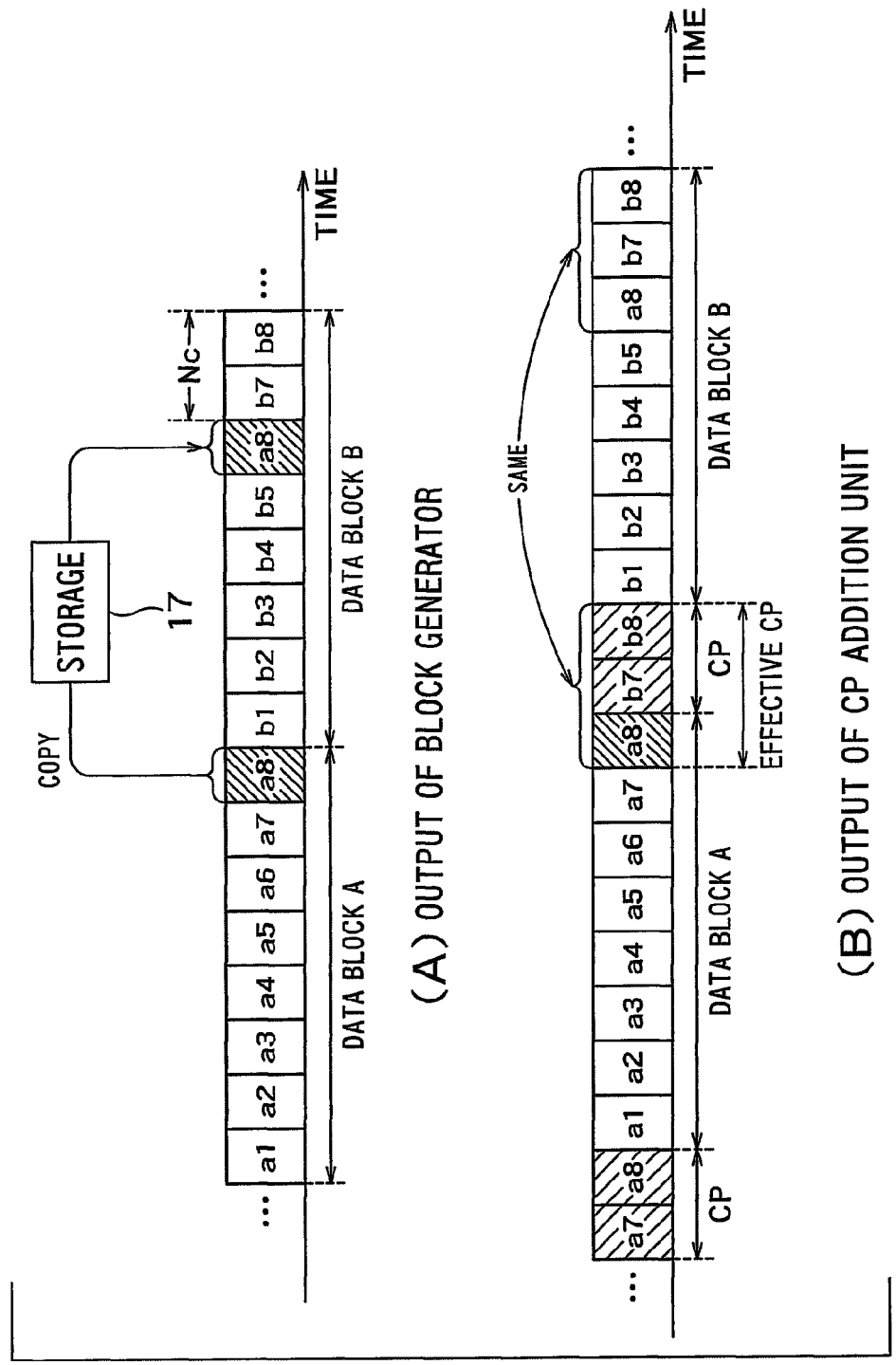
FIG. 2 shows an operation example of the block generator in the transmitter in FIG. 1.

FIG. 2 illustrates a specific operation example of the block generator 12. An example of substantially extending the CP size of the data block B by one data symbol (Ne=1) will be explained by taking a case where the data block size is 8 (N=8), the CP size added at the CP addition unit 13 is 2 (Nc=2).

FIG. 2(A) shows the data blocks A, B outputted from the block generator 12. As the third symbol from the end of the data block B, that is, the sixth symbol from the head, a copy (duplicate) of a data symbol a8 at the end of the data block A that precedes the data block B is used. That is, as k (k is an integer of 1 or greater) data symbols that precede data symbols b7, b8 added as cyclic prefix in the data block B, copy (duplicate) of k data symbols (one data symbol a8 in this example) at the end of the data block A that precedes the data block B are used. For seven data symbols b1, b2, b3, b4, b5, b7, b8 other than the sixth symbol of the data block B, the output from the modulator 11 is used just as is. In other words, in the data block B, the number of data symbols to be newly transmitted is reduced by the number of substantially expanded cyclic prefix and the transmission rate decreases accordingly.

When there is no data block that precedes a data block for which cyclic prefix is desired to be expanded, part of the target data block may be substituted by 0 using the above described method by regarding data symbols of the preceding data block as 0, but avoiding such processing may produce a better characteristic as a consequence. This is because when there is no preceding data block, there is no interference between blocks due to the preceding data block. The same also applies to a case where a cyclic postfix is expanded, which will be described later.

FIG. 2(B) shows the output of the CP addition unit 13. Copy (duplicate) of the last two data symbols a7, a8 of the data block A are added to the head of the data block A as a cyclic prefix and the last two data symbols b7, b8 of the data block B are added to the head of the data block B as a cyclic prefix. When the last three data symbols a8, b7, b8 of the data block B are compared with the last three data symbols that precede the data block B, it is apparent that the two are the same. This means that the cyclic prefix length of the data block B has been substantially extended to three data symbols. In other words, for multipath of up to three data symbols in length, the occurrence of interference among data blocks or interference among subcarriers is prevented at the output of the FFT processing unit at the receiver. Here, it should be noted that the data block size and the CP size added at the CP addition unit 13 have not been changed unlike the aforementioned conventional first and second extension methods. This is because, of the three data symbols that precede the data block B, a8 actually belongs to the data block A, not the data block B. The data symbol a8 is transmitted in two consecutive data blocks (data block A and data block B) except for a cyclic prefix. More generally, when the CP size is substantially extended by Ne symbols, if the extension size Ne is CP size Nc or below (Ne≦Nc), last Ne data symbols of each data block are transmitted in two consecutive data blocks.

Figure 3:
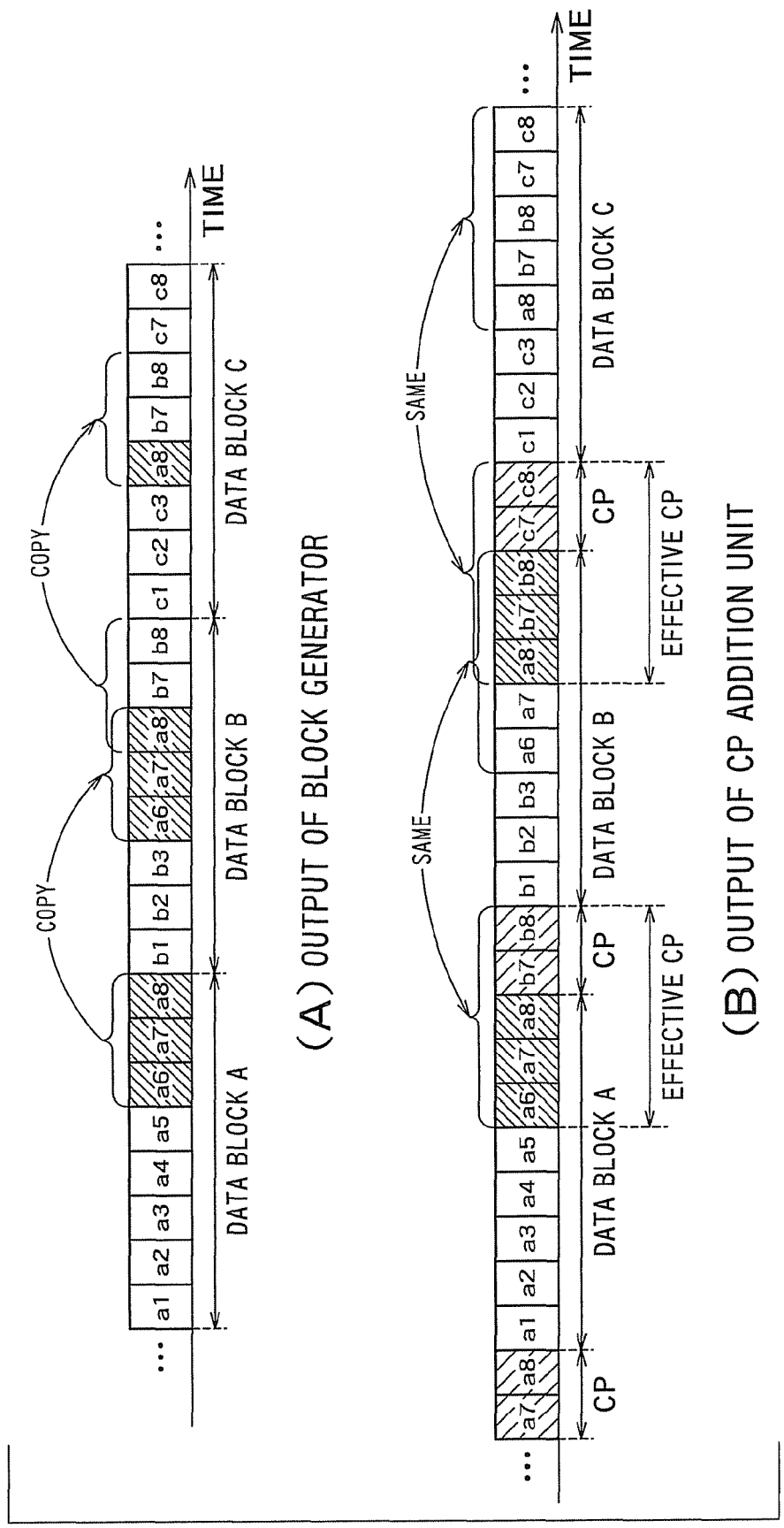
FIG. 3 shows another operation example of the block generator in the transmitter in FIG. 1.

FIG. 3 illustrates an operation example of the block generator 12 when extension size Ne>CP size Nc. An example where the CP size added at the CP addition unit 13 is 2 (Nc=2) and the CP size is substantially extended by three symbols (Ne=3) for the data block B and data block C will be explained.

FIG. 3(A) shows data blocks A, B, C outputted from the block generator 12. Data symbols a6, a7 in the data block A are transmitted twice in total in two data blocks A, B and data symbol a8 is transmitted three times in total in three data blocks A, B, C.

FIG. 3(B) shows the output of the CP addition unit 13. It is seen that the CP size has been substantially extended from 2 symbols to 5 symbols. More generally, assuming that the data block size is N, the CP size is Nc and the size by which CP is substantially extended (extension size) is Ne, an nth (n is an integer not less than 1 and not more than N) data symbol in a certain data block is transmitted in MAX(0, CEIL ((n−N+Ne)/Nc))+1 consecutive data blocks except a cyclic prefix added by the CP addition unit 13. Here, MAX(x,y) denotes the maximum between x and y, and CEIL(x) denotes the smallest integer greater than or equal to x.

In the examples in FIG. 2 and FIG. 3, data blocks are cyclically extended by adding a cyclic prefix to the head of a data block, but it is obvious that the present invention is also applicable when a cyclic postfix (hereinafter, abbreviated as "CS") is added to the end of a data block. Before explaining this, an example where a cyclic postfix is added at a conventional transmitter will be shown below.

FIG. 4(A) shows an example where a cyclic postfix (a cyclic postfix whose CS size is 2) of two symbols is added to the data block in FIG. 18(A) in the conventional transmitter (see FIG. 17). Two symbols a1, a2 at the head of the data block A are copied (duplicated) and added to the end as a cyclic postfix. In the same way, two symbols by, b2 at the head of the data block B are copied (duplicated) and added to the end as a cyclic postfix. Trying to extend the cyclic postfix length using a point of view similar to the above described conventional first and second extension methods will result in a problem similar to the one when extending the cyclic prefix length.

Hereinafter, an operation of the block generator 12 which substantially extends the CS size when the CP addition unit 13 in the transmitter in FIG. 1 adds a cyclic postfix, not a cyclic prefix will be explained using FIG. 4(B) and FIG. 4(C).

When the CS size added by the CP addition unit 13 is Nc symbols, in order to substantially extend the CS size of a certain data block (e.g., data block B) by Ne symbols, copy (duplicate) of Ne consecutive symbols from the Ncth symbol to the (Nc−Ne+1)th symbol toward the head of the data block (e.g., data block A) that precedes the data block B saved in the storage 17 are used. That is, as the last k data symbols of the data block B, copy (duplicate) of k data symbols (one data symbol a2 in this example) from the end (data symbol a2 in this example) toward the head of the data symbols used as a cyclic postfix in the data block A that precedes the data block B are used. FIG. 4(B) shows an example when Nc=2, Ne=1. However, when Nc−Ne+1 is equal to or less than 0, one immediately preceding symbol of the first symbol of the data block A is regarded as being connected to the symbol at the end of the data block A. As for other data symbols of the data block B, the data symbols outputted from the modulator 12 are used just as they are.

The CP addition unit 13 adds a cyclic postfix to the data blocks generated in this way at the block generator 12 and allows, as shown in FIG. 4(C), a symbol a2 at the end of a cyclic postfix (CS) of a data block (e.g., data block A) immediately preceding a data block (e.g., data block B) to be regarded as part of the data block B, which means that the CS length has been substantially extended.

In this way, since both the addition of a cyclic prefix and the addition of a cyclic postfix (CS) are processing which extends a data block in a periodic structure, both additions are obviously equivalent if both are regarded as ones whose data arrangement has been changed. Therefore, in the following explanations, unless specified otherwise, a cyclic prefix will be used as an example but it is obvious that the present invention is also applicable to the case with a cyclic postfix.

Figure 5:
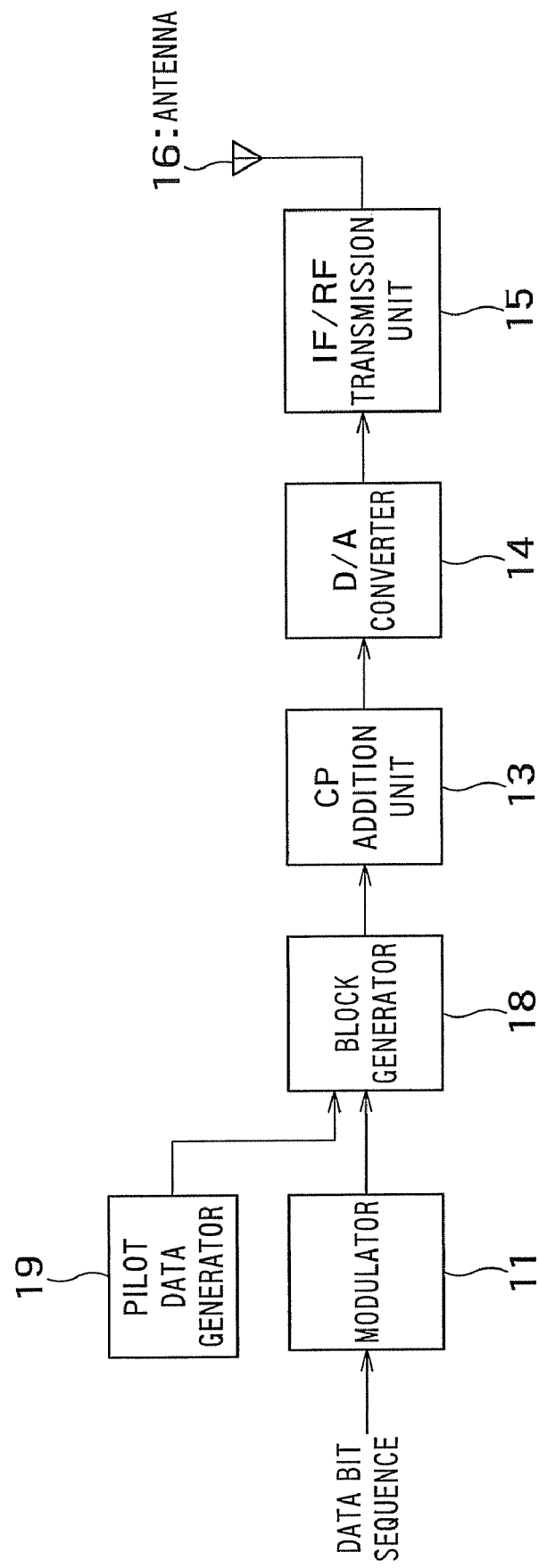
FIG. 5 shows a second embodiment of the single carrier transmitter of the present invention.

FIG. 5 shows a second embodiment of the single carrier transmitter according to the present invention.

In the first embodiment, copy (duplicate) of data symbols of a preceding data block are used as data symbols at specific positions of a data block whose CP size is desired to be substantially extended. In the second embodiment, copy (duplicate) of data symbols of a data block whose CP size is desired to be substantially extended are used as data symbols at specific positions of a data block that precedes the data block whose CP size is desired to be substantially extended. The second embodiment is preferably used when a data block whose CP size is desired to be substantially extended includes data symbols of fixed values such as pilot symbols. A difference thereof from the first embodiment shown in FIG. 1 lies in that there is no storage 17 and a pilot data generator 19 which generates pilot data is provided on the input side of a block generator 18 instead. Since operations of the respective elements in and after the CP addition unit 13 are the same as those of the first embodiment, explanations thereof will be omitted and the operation of the block generator 18 will be explained hereinafter.

When the CP size which is added by a CP addition unit 13 is Nc symbols, suppose that the CP size of a certain data block composed of a plurality of pilot symbols (e.g., data block B) is desired to be substantially extended by Ne symbols. In this case, copy (duplicate) of Ne pilot symbols from the (Nc+1)th to (Nc+Ne)th pilot symbols counted from the end of a data block B are used as Ne symbols from the end of the data block (e.g., data block A) that precedes the data block B. In the first embodiment, the data block whose CP size is desired to be extended itself is operated, but it should be noted that the second embodiment requires an operation on the data block that precedes the data block whose CP size is desired to be extended.

Figure 6:
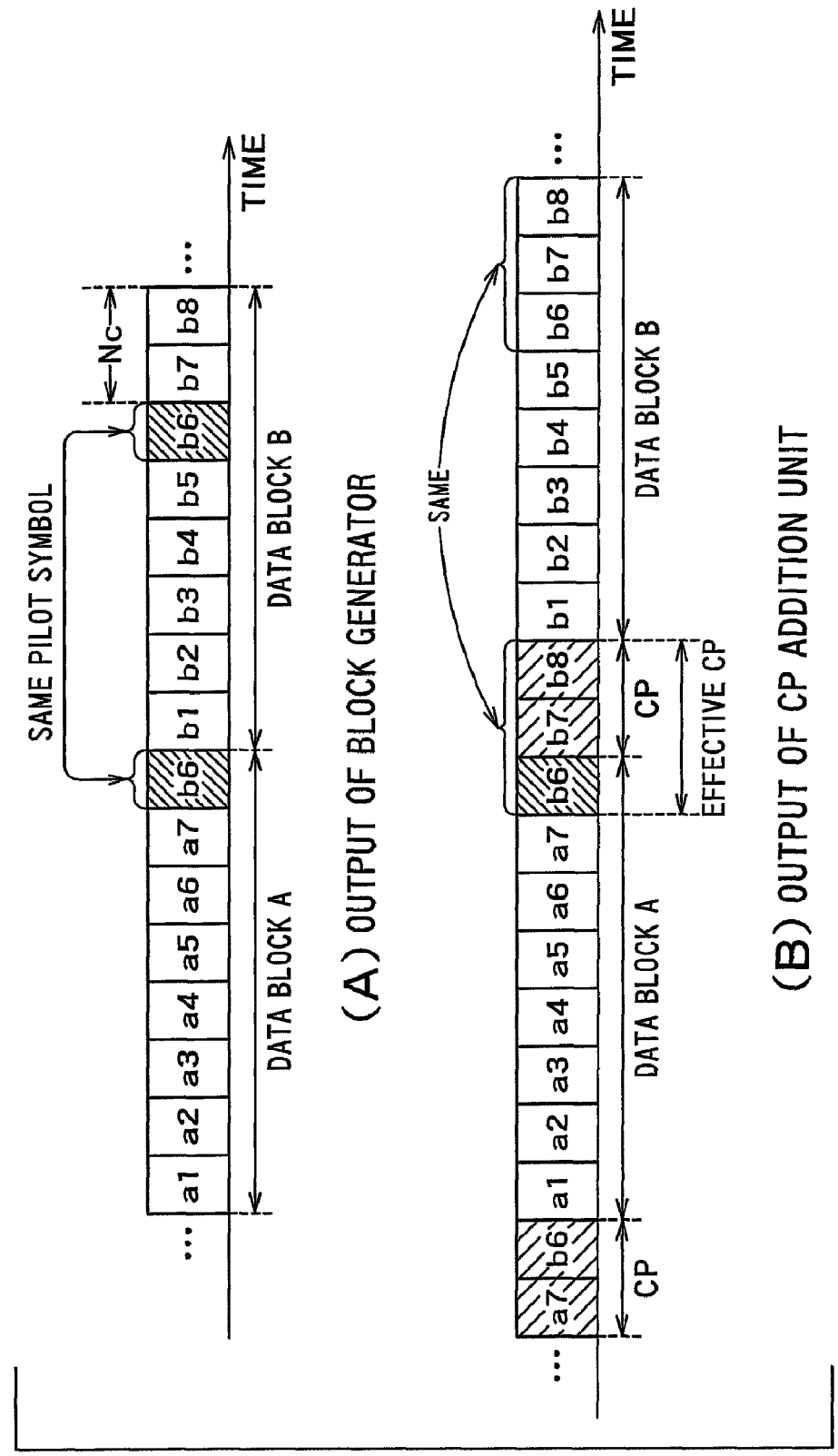
FIG. 6 shows an operation example of the block generator in the transmitter in FIG. 5.

In the case where the data block size is 8 (N=8) and the CP size added by the CP addition unit is 2 (Nc=2), an operation example of the block generator 18 when the CP size of the data block B made up of pilot symbols is substantially extended by one symbol (Ne=1) will be explained using FIG. 6.

FIG. 6(A) shows the data blocks A, B outputted from the block generator 18. A copy of a sixth pilot symbol b6 of the data block B is used as the symbol at the end of the data block A that precedes the data block B. That is, copy (duplicate) of k (1 (=Ne) in this example) data symbols that precede data symbols b7, b8 added as a cyclic prefix in the data block B that follows the data block A are used as k (1 (=Ne) in this example) data symbols at the end of the data block A.

In this way, when the processing at the block generator 18 is carried out, as shown in FIG. 6(B), last three data symbols b6, b7, b8 of the data block B become the same as three data symbols that precede the data block B at the output of the CP addition unit 13. In other words, it is possible to obtain an effect equivalent to the cyclic prefix length of the data block B being substantially extended to three data symbols.

The operation of the block generator 18 when a cyclic prefix is added to the head of a data block has been explained above, but the operation of the block generator 18 when a cyclic postfix is added to the end of the data block will be explained hereinafter. An example of substantially extending (Ne=1) the CS size of the data block B composed of pilot symbols by one symbol when the data block size is 8 (N=8), the CS size added by the CP addition unit is 2 (Nc=2) will be shown.

FIG. 7(A) shows the data blocks A, B outputted from the block generator 18. A copy of an eighth pilot symbol b8 of the data block B is used as a second symbol of the data block A that precedes the data block B. In other words, a copy of last k (1 (=Ne) in this example) data symbol b8 of the data block B which follows the data block A is used as k (1 (=Ne) in this example) data symbols from the end (second symbol) toward the head of the data symbol used as a cyclic postfix in the data block A. When Nc−Ne+1 is equal to or less than 0, suppose that a symbol immediately preceding the first symbol in the data block A is treated as being connected to the symbol at the end of the data block A.

When such processing at the block generator 18 is carried out, as shown in FIG. 7(B), last three data symbols b8, b1, b2 of the data block B with a cyclic postfix become the same as three data symbols preceding a data symbol b3 of the data block B at the output of the CP addition unit 13. In other words, it is possible to obtain an effect equivalent to the cyclic postfix length (CS length) of the data block B being substantially extended to three data symbols by regarding the data block B as if being composed of 8 symbols from the last symbol b8 to b7 of the cyclic postfix (CS) of the data block A.

Figure 8:
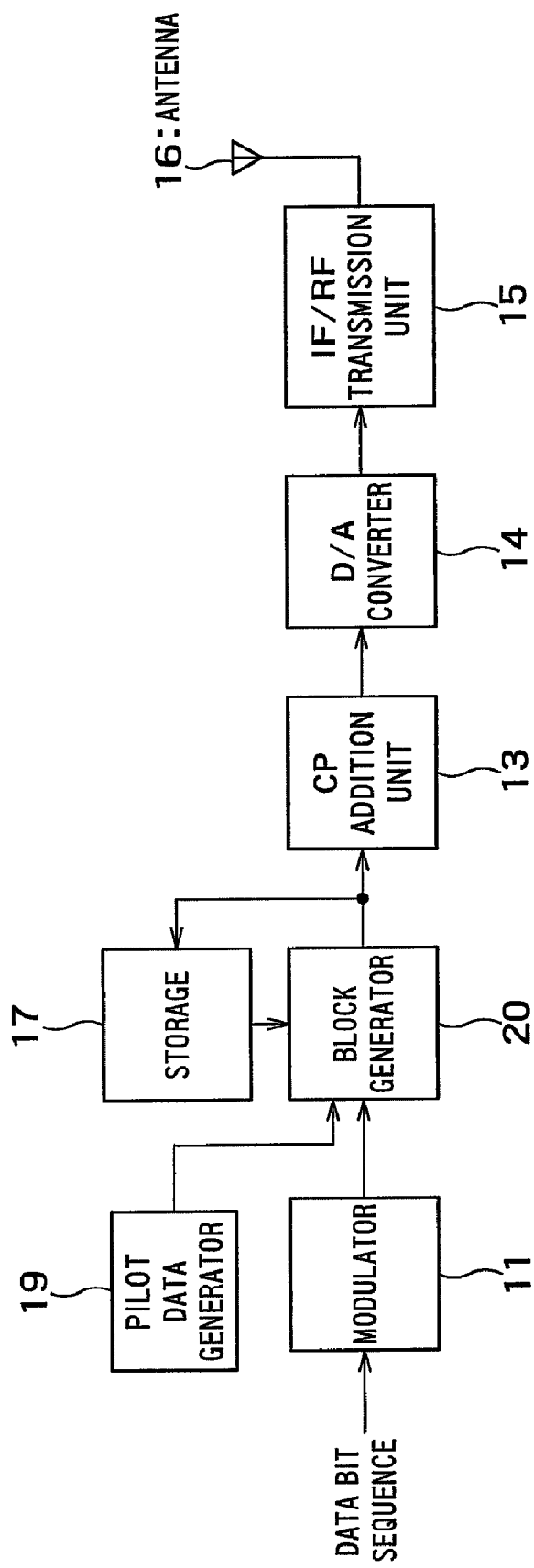
FIG. 8 shows a third embodiment of the single carrier transmitter of the present invention.

FIG. 8 shows a third embodiment of the single carrier transmitter according to the present invention.

The third embodiment is a combination of the first embodiment and the second embodiment. A block generator 20 of the third embodiment generates a data block using data symbols in data blocks generated in the past and saved in a storage 17 and pilot symbols in data blocks that follow the data block in addition to data symbols outputted from a modulator 11. Hereinafter, an operation example of the block generator 20 will be explained.

Figure 9:
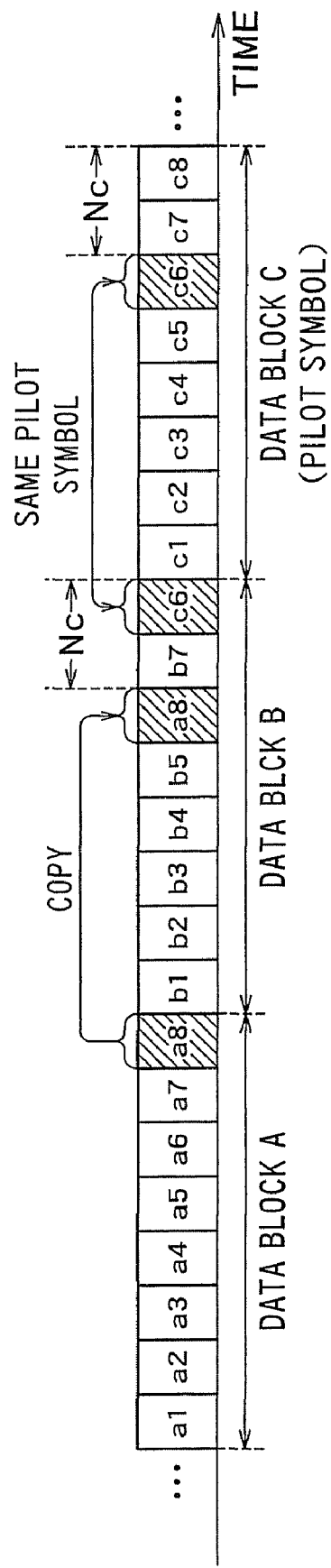
FIG. 9 shows an operation example of the block generator in the transmitter in FIG. 8.

When there are three consecutive data blocks (data block A, data block B, data block C) and the data block C of these blocks is composed of pilot symbols, suppose the CP sizes of the data block B and the data block C are desired to be substantially extended (Ne=1) by one symbol respectively. FIG. 9 shows each data block generated by the block generator 20 in this case.

When attention is focused on the data block B, since the following data block C is composed of pilot symbols, in order to substantially extend the CP size of the data block C first, a copy of a sixth pilot symbol c6 of the data block C is used as the last symbol of the data block B. Next, in order to substantially extend the CP size of the data block B, a copy of a last data symbol a8 of the data block A is used as a sixth symbol of the data block B. Thus, when a following data block is composed of pilot symbols first, it is preferable to carry out processing of substantially extending the CP size of the following data block first and then carry out processing of substantially extending the CP size of the target data block. Here, it is obvious that the single carrier transmitter according to the present invention can substantially extend a cyclic prefix in sizes differing from one data block to another and it is thereby possible to even extend CP in a larger scale for the data block composed of pilot symbols requiring higher reception quality than other data blocks.

Figure 10:
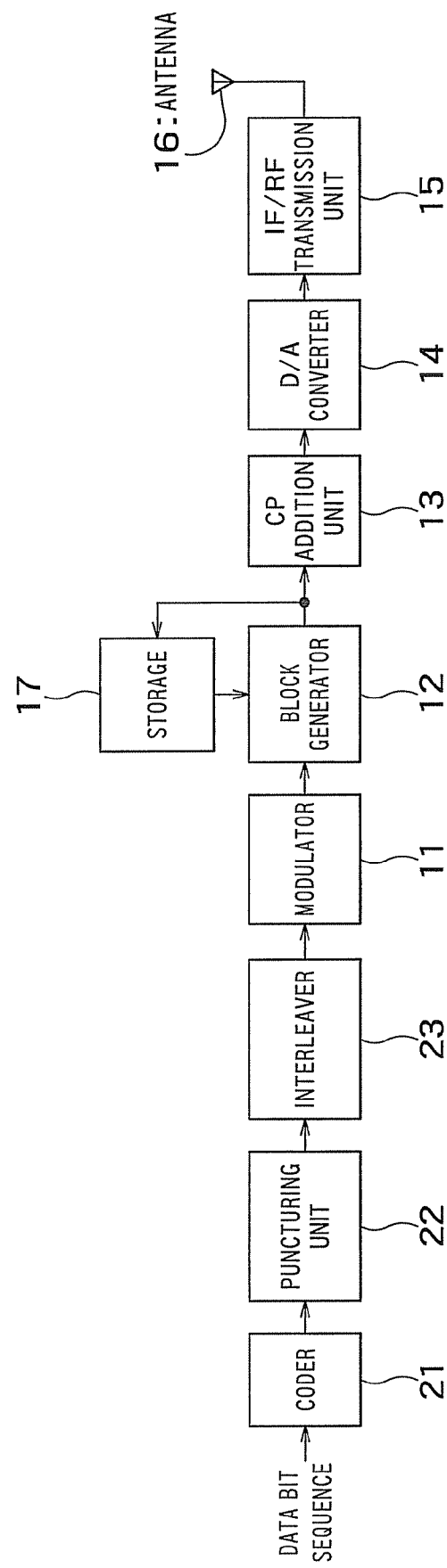
FIG. 10 shows a fourth embodiment of the single carrier transmitter of the present invention.

FIG. 10 shows a fourth embodiment of the single carrier transmitter according to the present invention. Since elements in and after a modulator 11 are the same as those in FIG. 1, detailed explanations of these elements will be omitted. It is also possible to combine the elements up to an interleaver 23 in FIG. 10 with the elements in and after the modulator in the second embodiment or third embodiment.

A feature of the fourth embodiment lies in that in order to compensate for a data rate which diminishes when substantially extending the CP size at a block generator 12, a puncturing unit 22 punctures coded bits inputted to the modulator 11. In this example, the data rate is adjusted through puncturing processing, but it is also possible to use a method of changing the coding rate itself of a coder 21 and a method of changing a modulation multivalue number of the modulator 11 or the like in addition to this.

Hereinafter, operations of the coder 21, puncturing unit 22 and interleaver 23 will be explained.

A data bit sequence which becomes transmission data is subjected to error correction coding processing at the coder 21 and thereby converted to a coded bit sequence with redundancy added thereto. For example, in the case of a coding rate ½, two coded bits are outputted for input of one data bit.

The puncturing unit 22 performs processing of puncturing (removing) a certain number of coded bits from a plurality of consecutive coded bits. The number of coded bits to be punctured at the puncturing unit 22 depends on the scale of substantially extending the CP size at the block generator 12. More specifically, the puncturing unit 22 punctures coded bits which correspond to the number of transmission data symbols reduced by transmitting the same data symbol in consecutive data blocks or the number of transmission data symbols reduced by transmitting the data blocks made up of pilot symbols. For example, when the data block size is N and the CP size to be extended is Ne, the puncturing unit 22 punctures Ne out of N coded bits on an average. That is, as the number of data symbols copied (duplicated) from other data blocks increases, the number of coded bits to be punctured from the coded data bit sequence which corresponds to the data block is increased.

The coded bit sequence outputted from the puncturing unit 22 is subjected to interleaving processing at the interleaver 23, whereby the sequence of the coded bit is changed, and inputted to the modulator 11. As the interleaving method used by the interleaver 23, in addition to conventionally used block interleaving or the like, it is also possible to perform rearrangement according to positions of the coded bits punctured at the puncturing unit 22 and positions of the data symbols to be transmitted by a plurality of data blocks caused when the CP size is substantially extended by the block generator 12. That is, it is also possible to perform rearrangement such that both the coded bits punctured by the puncturing unit 22 and the data bits included in data symbols to be transmitted in a plurality of data blocks resulting from substantially extending the CP size are a plurality of coded bits outputted during the same state transition of convolutional coding. When such rearrangement is performed, bits remaining after the puncturing by the puncturing unit 22 out of a plurality of bits outputted during the same state transition are transmitted in a plurality of data blocks, and it is thereby possible to expect that combining processing at the receiver (which will be described later) suppress degradation of the decoding characteristic of error correction coding due to puncturing to a minimum.

Hereinafter, the operations up to the block generator 12 will be explained with reference to FIG. 11 by taking a case using convolutional coding at a coding rate of ½ as error correction coding and using a modulation scheme (e.g., QPSK modulation scheme) whereby two bits are mapped to one symbol at the modulator 11.

When eight bits (suppose these bits correspond to one data block) are inputted to the coder 21, 16 coded bits x1 to x16 are outputted as shown in FIG. 11(A). Consecutive two-bit pairs (x1 and x2), (x3 and x4), . . . , (x15 and x16) in this case are a plurality of (two, here) coded bits outputted due to the same state transition in convolutional coding. Suppose the puncturing unit 22 excludes two bits x3 and x11 from these coded bits and 14 coded bits remain (FIG. 11(B)). This corresponds to a case where the data block size is 8 and the CP size is substantially extended by one symbol or the like. In this way, when performing error correction coding of a data bit sequence corresponding to a data block, the puncturing unit 22 punctures some of the plurality of coded bits obtained at the time of the same state transition.

If the CP size of the following data block is substantially extended by one symbol, the data symbol at the end of the data block is also transmitted in the following data block. Therefore, the interleaver 23 performs rearrangement of coded bits (FIG. 11(C), FIG. 11(D)) so that at least one of x4 and x12, which are coded bits outputted through the same state transition as that of the coded bits excluded by the puncturing unit 22 is included in the last data symbol of the data block. In other words, the interleaver 23 performs interleaving on the coded data bit sequence so that the remaining coded bits out of the above described plurality of coded bits are located at the end. Here, rearrangement is performed so that both the coded bits x4 and x12 are included in the last data symbols. By applying such processing, the coded bits x4 and x12 are transmitted twice together with the following data block and it is thereby possible to suppress performance degradation due to puncturing when demodulating a convolutional code to a minimum.

Figure 4:
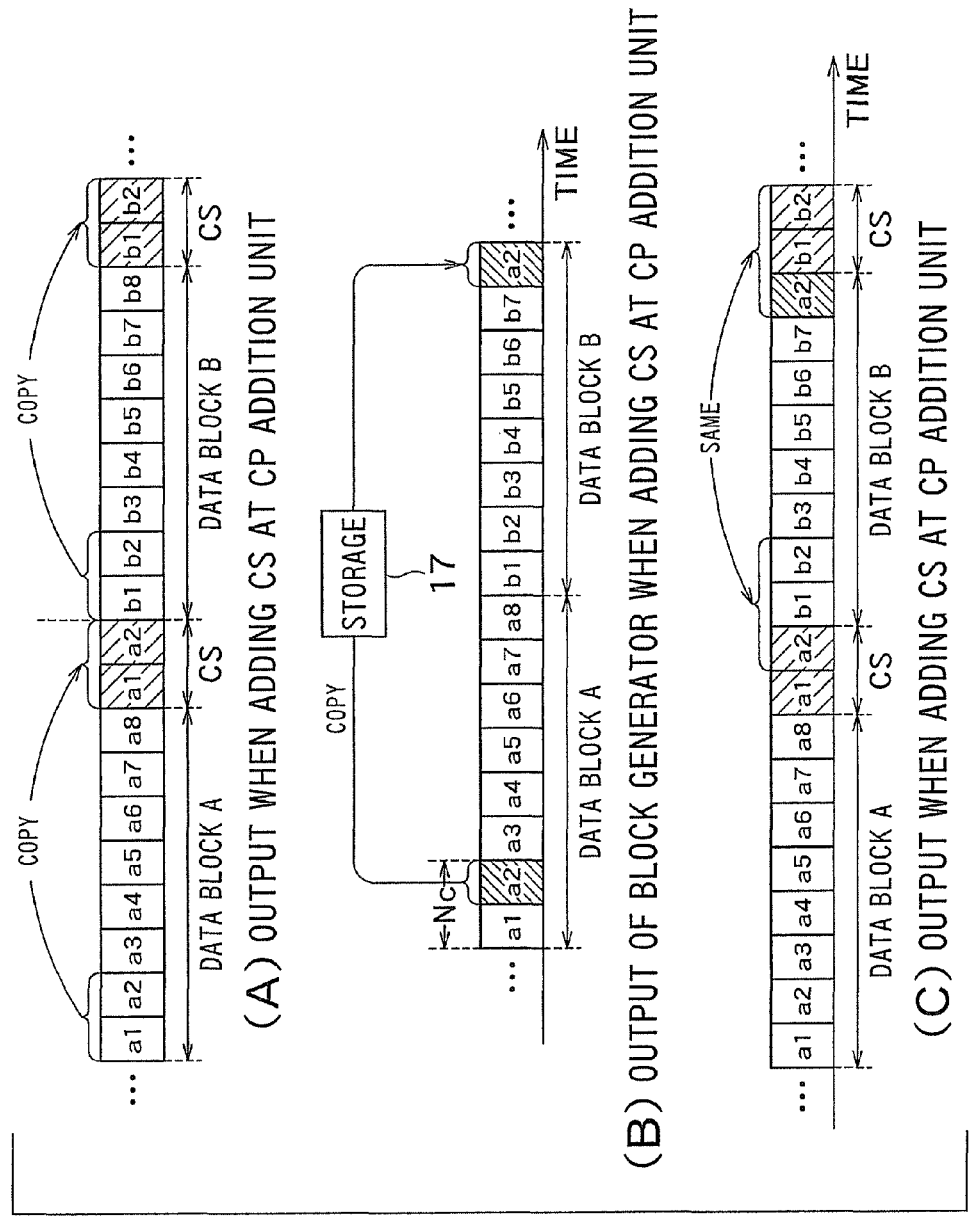
FIG. 4 shows a further operation example of the block generator in the transmitter in FIG. 1.
Figure 7:
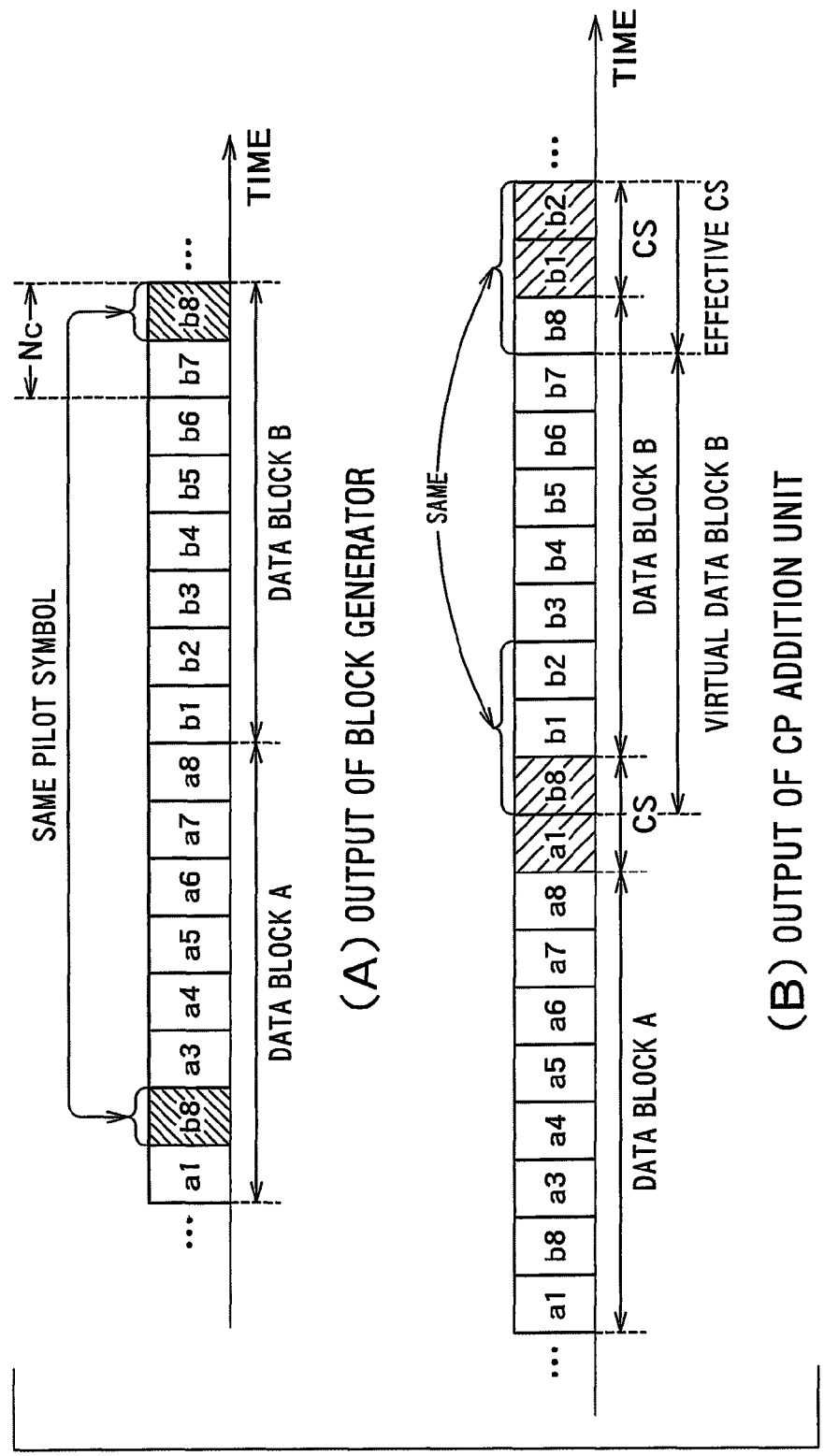
FIG. 7 shows an operation example of the block generator in the transmitter in FIG. 5.

However, when a cyclic postfix is added as shown in FIG. 4, the coded data bit sequence is interleaved so that the remaining coded bits of the above described plurality of coded bits are included in the last data symbols which are used as a cyclic postfix in the data block B. Furthermore, when a cyclic prefix is added as shown in FIG. 6, the coded data bit sequence is interleaved so that the remaining coded bits of the above described plurality of coded bits are included in the last data symbols out of the data symbols preceding the data symbol copied (duplicated) for cyclic prefix in the data block A (effective when the technique in FIG. 6 is applied to the data block preceding the data block A). Furthermore, when a cyclic postfix is added as shown in FIG. 7, the coded data bit sequence is interleaved so that the remaining coded bits of the above described plurality of coded bits are included in the last data symbols of the data block A (effective when the technique in FIG. 7 is applied to the data block preceding the data block A). However, when pilot symbols are copied (duplicated) using the techniques in FIG. 6 and FIG. 7 and transmitted in a plurality of data blocks, since pilot symbols are known data, the coded data bit sequence need not be interleaved using the above described specific method.

Figure 11:
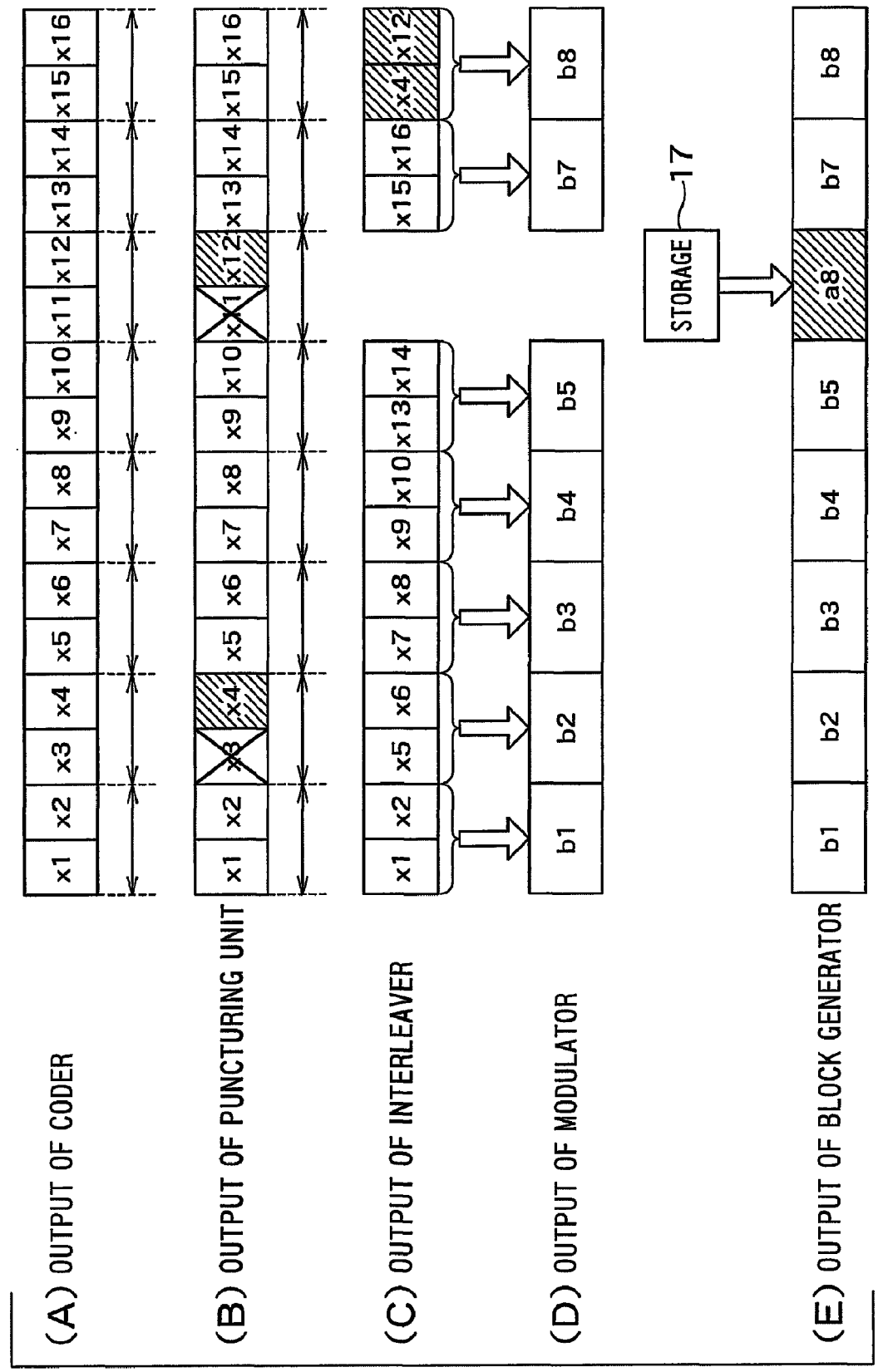
FIG. 11 shows an operation example of the transmitter in FIG. 10.

Returning to FIG. 11, the block generator 12 generates a data block from seven data symbols b1 to b5, b7, b8 generated from 14 coded bits, and data symbol a8 copied (duplicated) from the preceding data symbol (FIG. 11(E)). After a cyclic prefix is added thereto at a CP addition unit 13, the data symbol generated in this way is transmitted from an antenna 16 through a D/A converter 14 and an IF/RF transmission unit 15.

Next, the single carrier receiver to demodulate a signal from the single carrier transmitter according to an embodiment of the present invention will be described. A feature of this single carrier receiver is to perform processing of combining the same data symbols to be transmitted in a plurality of consecutive data blocks resulting from the block generator of the single carrier transmitter having substantially extended the CP size.

Figure 12:
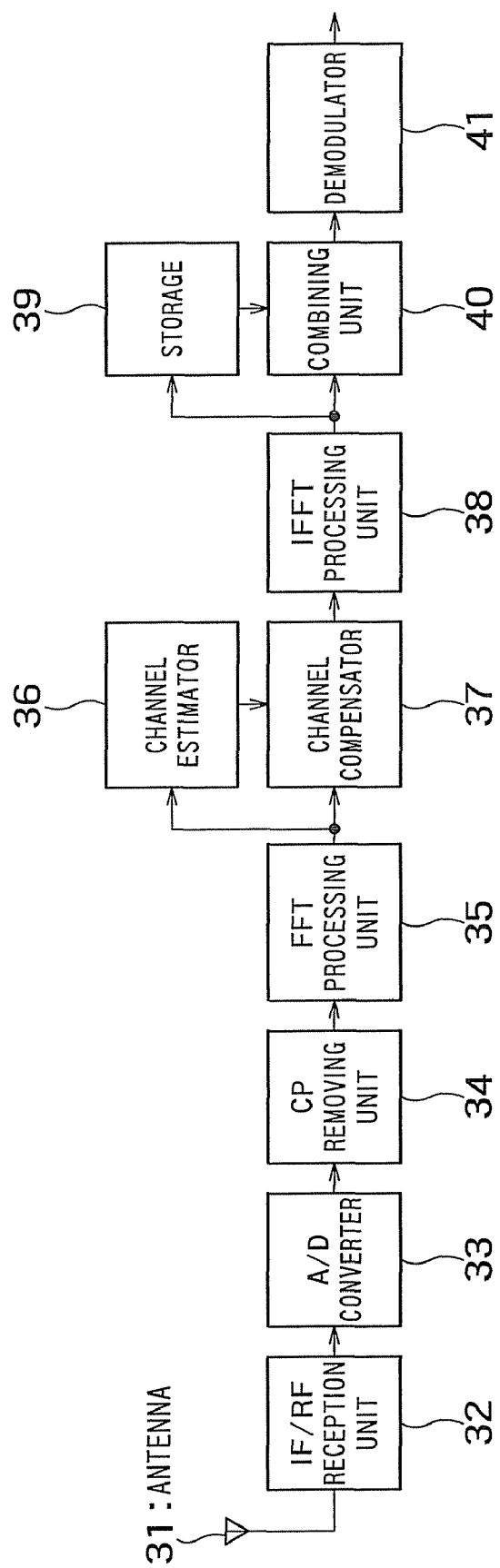
FIG. 12 shows a first embodiment of the single carrier receiver of the present invention.

FIG. 12 shows a first embodiment of the single carrier receiver according to the present invention.

A signal received by an antenna 31 is converted to a baseband signal at an IF/RF reception unit 32 and then converted to a digital signal at an A/D converter 33.

A CP removing unit 34 removes sample points (cyclic prefix or cyclic postfix) of the digital signal of the CP length added at the CP addition unit of the transmitter.

An FFT processing unit 35 performs Fourier transform processing of a time length which corresponds to the transmitted data block and breaks it down to a plurality of frequency components which are orthogonal to each other.

Based on signals of a plurality of frequency components obtained from the data block composed of pilot symbols, channel estimator 36 estimates channel responses of the respective frequency components.

A channel compensator 37 multiplies the signals corresponding to the plurality of frequency components outputted from the FFT processing unit 35 by complex numbers based on estimated values of the channel responses of the respective frequency components estimated by the channel estimator 36 and thereby corrects distortion of the respective frequency components produced in the channels (equalization processing).

The signals of the frequency components outputted from the channel compensator 37 and subjected to equalization processing are subjected to an inverse Fourier transform at an IFFT (Inverse Fast Fourier Transform) processing unit 38 and thereby converted to a signal on the time axis which is equal to the transmitted data block size. The output signal of the IFFT processing unit 38 which corresponds to the transmitted data block will be referred to as a "received data block." Moreover, a sample value in a received data block which corresponds to each data symbol in a transmitted data block will be referred to as a "received data symbol."

Next, a combining unit 40 checks each received data symbol in the received data block whether or not received data symbols in the past which correspond to the same transmission data symbols are saved in a storage 39 and when the data symbols are saved, the combining unit 40 combines and processes the corresponding received data symbols. That is, the combining unit 40 combines a received data symbol at a first position specified beforehand in a received data block specified beforehand and a received data symbol at a second position specified beforehand in a received data block that follows (or precedes) the above described received data block specified beforehand and generates a combined received data symbol to be used instead of the received data symbol at the above described first position. As for the correspondence of received data symbols between received data blocks, suppose, for example, the receiver acquires information on the correspondence from the transmitter as broadcast information and sets it in the combining unit 40 beforehand. Examples of possible combining methods at the combining unit 40 include methods such as equal gain combining and maximum ratio combining by multiplying the received data by weights proportional to an SINR (signal-to-interference and noise power ratio) of the corresponding received data symbols and then combining the received data or the like.

A demodulator 41 demodulates data bits for which transmission data symbols have been estimated from the respective received data symbols to which combining processing has been applied as required. In other words, the demodulator 41 demodulates received data symbols at positions different from the above described first position and the above described combined received data symbols in the above described received data block specified beforehand.

Hereinafter, operations of the IFFT processing unit 38 and subsequent units will be explained in detail using FIG. 13.

Figure 13:
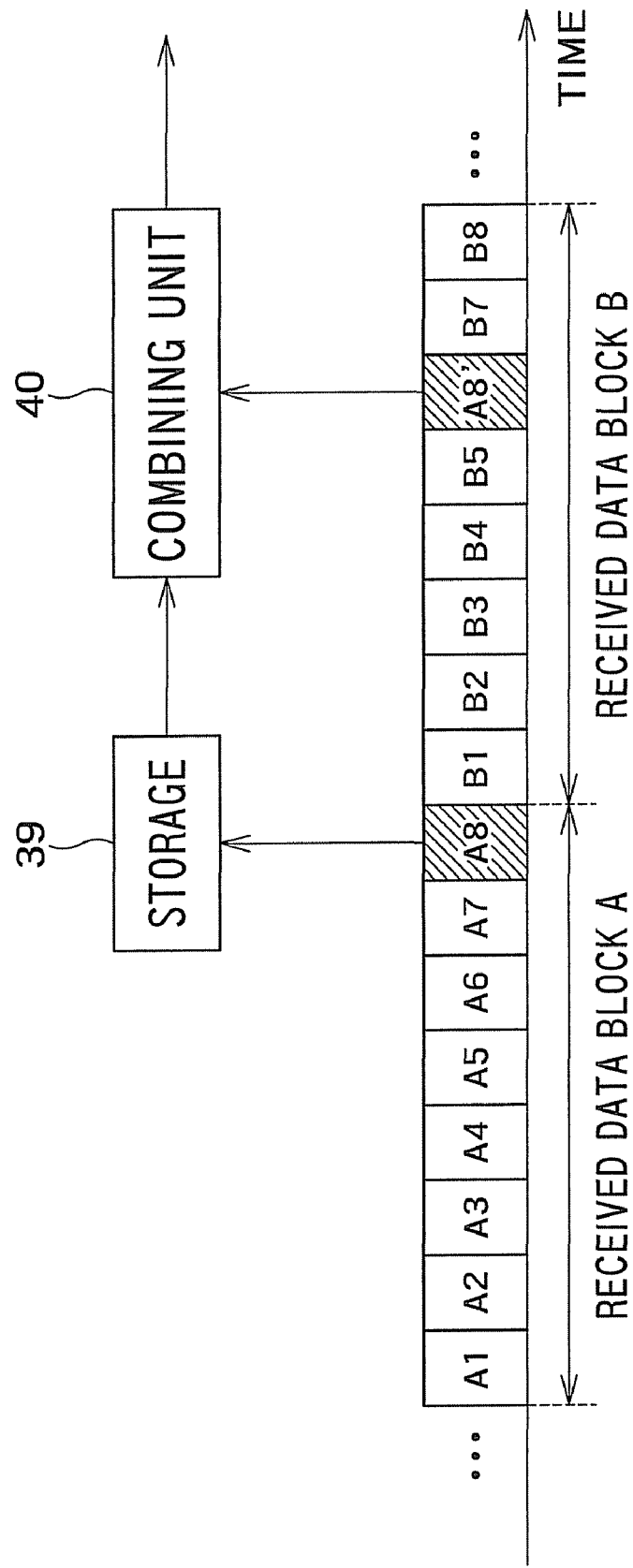
FIG. 13 shows an operation example of the receiver in FIG. 12.

FIG. 13 shows a received data block A and a received data block B consecutively outputted from the IFFT processing unit 38. Suppose these received data blocks A, B correspond to the two consecutive data blocks shown in FIG. 2(A) at the transmitter. An eighth received data symbol A8 of the received data block A and a sixth received data symbol A8' of the received data block B correspond to the same transmission data symbol (a8 in FIG. 2(A)). The storage 39 stores the received data symbol A8 and the combining unit 40 combines this received data symbol A8 with the received data symbol A8'. The demodulator 41 demodulates data from a value obtained by combining the received data symbols A8 and A8' (combined received data symbol). Other received data symbols A1 to A7 in the received data block A are passed through the combining unit 40 without being subjected to any processing and the data is demodulated at the demodulator 41. Furthermore, as for the received data block B, received data symbols B1 to B5, B7 and B8 are passed through the combining unit 40 without being subjected to any processing and demodulated at the demodulator 41.

Figure 14:
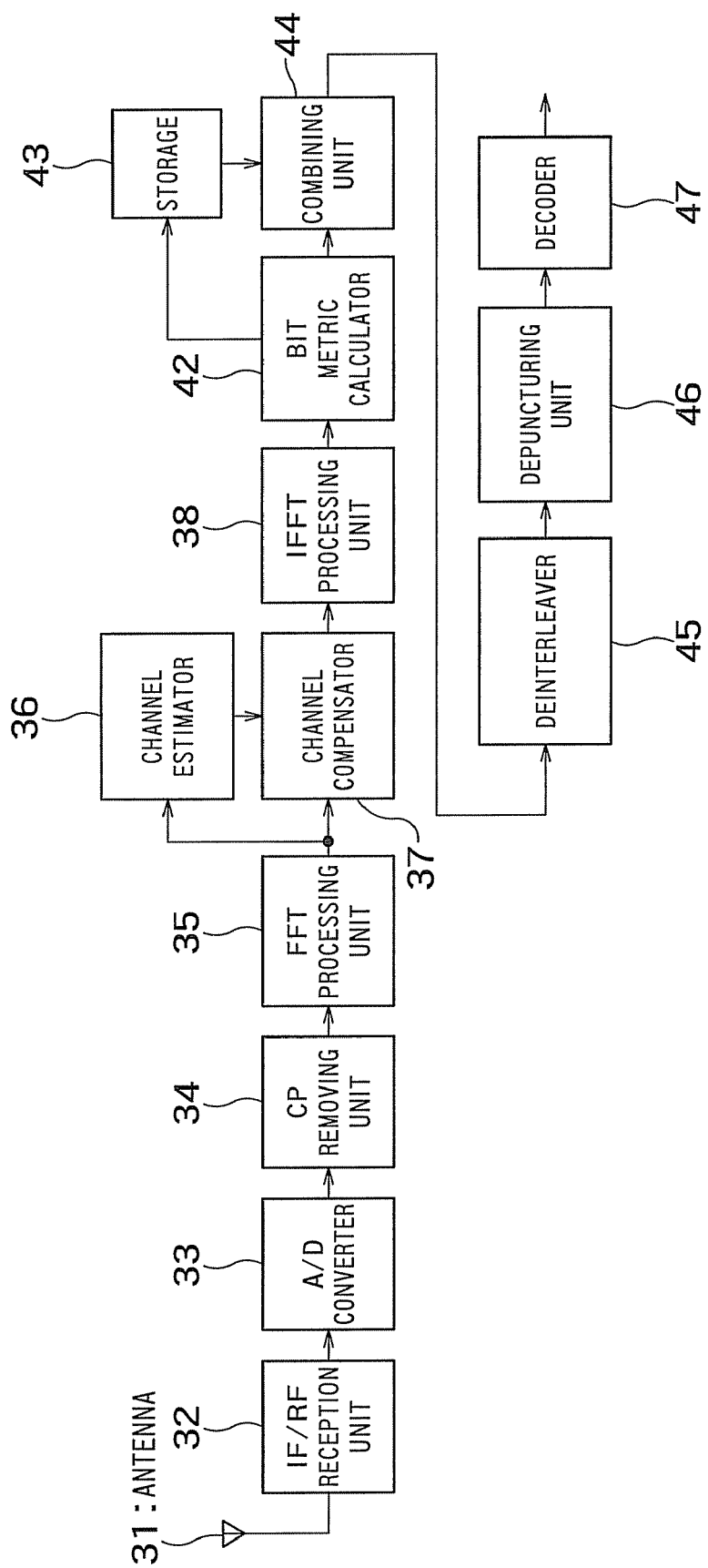
FIG. 14 shows a second embodiment of the single carrier receiver of the present invention.

FIG. 14 shows a second embodiment of the single carrier receiver according to the present invention. The second embodiment is designed to demodulate a signal transmitted from the transmitter (fourth embodiment) in FIG. 10. Reception processing which corresponds to coding, puncturing processing and interleaving processing applied by the transmitter is added to the receiver shown in FIG. 12. In FIG. 14, operations of an antenna 31 to an IFFT processing unit 38 are the same as those of the receiver in FIG. 12, and therefore explanations thereof will be omitted.

A bit metric calculator 42 calculates the likelihood of each bit corresponding to each received data symbol (soft decision bit data or bit likelihood data) from each received data symbol included in the received data block which is the output of the IFFT processing unit 38.

A combining unit 44 checks whether or not bit likelihood data in the past which corresponds to the same transmission data bit is saved in a recording unit 43 for the bit likelihood data outputted from the bit metric calculator 42 and when the bit likelihood data is saved, the combining unit 44 combines the corresponding bit likelihood data. That is, the combining unit 44 combines first bit likelihood data generated from the received data symbol at a third position specified beforehand in the received data block specified beforehand and second bit likelihood data generated from the received data symbol at a fourth position specified beforehand in the received data block that follows (or precedes) the above described received data block specified beforehand, and generates third bit likelihood data to be used instead of the first bit likelihood data.

As for the correspondence of bit likelihood data between the received data blocks (or correspondence of the received data symbols), for example, suppose that the receiver acquires the information on the correspondence from the transmitter as broadcast information and sets it in the combining unit 44 beforehand.

A deinterleaver 45 changes the sequence of the bit likelihood data obtained from the received data block and subjected to combining processing as required in such a way that the sequence changed by the interleaver of the transmitter is restored to its original sequence.

A depuncturing unit 46 inserts 0 (in the case of a logarithmic likelihood value) as a bit metric of the part excluded at the puncturing unit of the transmitter.

Finally, a decoder 47 performs error correction decoding processing on the bit sequence in which the depuncturing unit 46 has inserted 0 and decoding of data bits is completed.

Here, when demodulating a data block, part of which has been replaced by pilot symbols as in the case of the signal transmitted from the transmitter shown in FIG. 5 or FIG. 8 (second embodiment or fourth embodiment), data symbols which are known data (e.g., data symbol b6 of data block A in FIG. 6(A)) may be ignored and other data symbols in the data block may be demodulated. A data block composed of only pilot symbols (e.g., the data block B in FIG. 6(A)) is used to estimate the frequency response in the channel at the channel estimator 36 of the receiver as described above.

Furthermore, when substantially extending the CP size of a data block composed of pilot symbols, if some of pilot symbols in the data block are replaced with data symbols of the preceding data block and transmitted using the method of the transmitter in FIG. 1 (first embodiment) instead of the transmitter in FIG. 5 (second embodiment), the following method may be used to estimate the channel from the data block. First, the above described data symbols in the preceding data block are demodulated and data symbols in the data block are handled as known data using the demodulation result. In this way, since all the pilot symbols and data symbols in the data block can be regarded as known data, the channel can be estimated using the entire data block.

Figure 15:
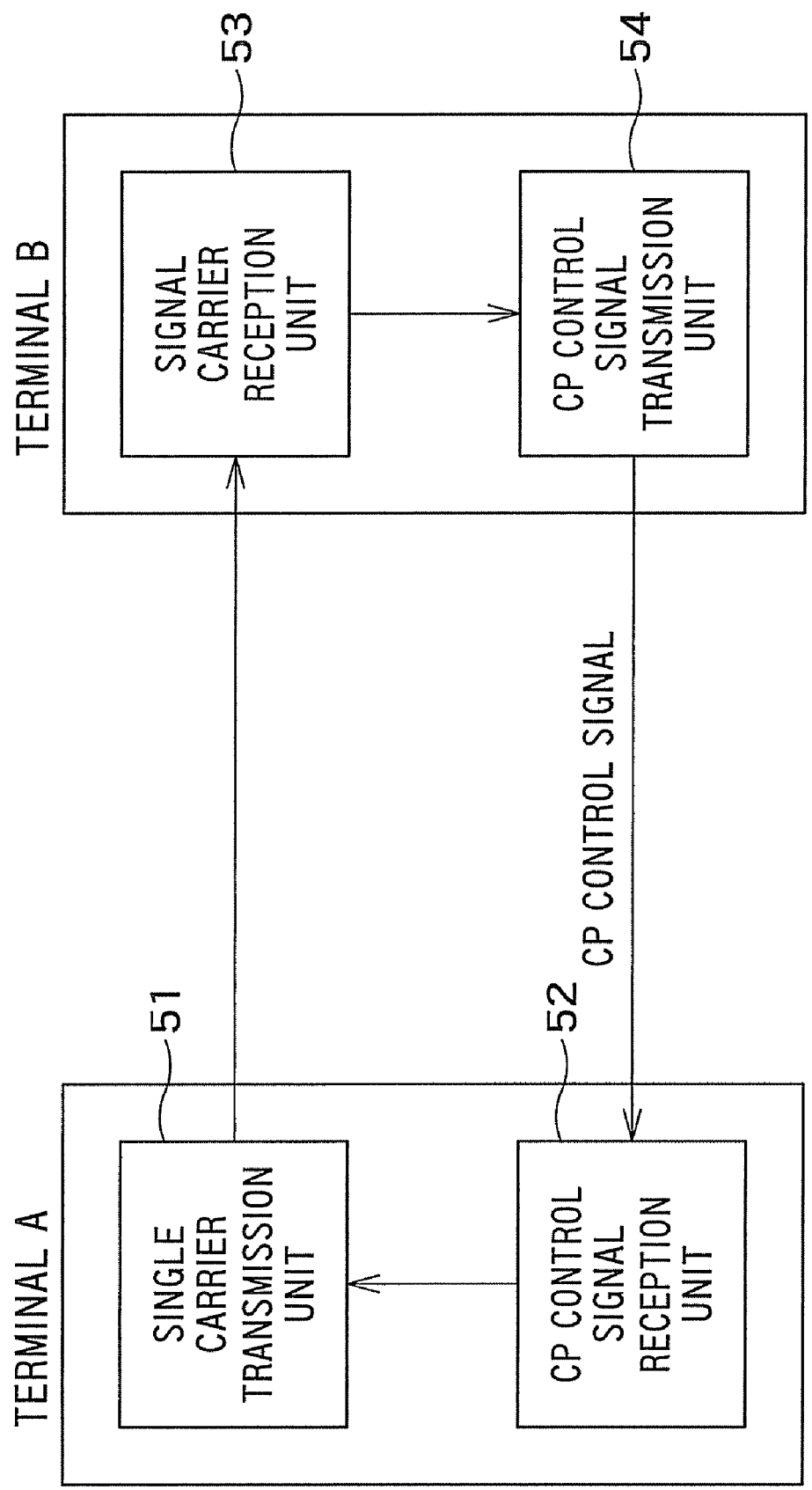
FIG. 15 shows a radio communication system made up of the single carrier transmitter and the single carrier receiver according to the first embodiment of the present invention.

FIG. 15 shows a radio communication system composed of a terminal A equipped with the function of a single carrier transmitter of the present invention (single carrier transmission unit 51) and a terminal B equipped with the function of the single carrier receiver (single carrier reception unit 53).

According to a state of the channel from the terminal A to the terminal B, the terminal B transmits a CP control signal to give instruction to substantially extend (change) the CP size of the terminal A at the single carrier transmission unit 51 from a CP control signal transmission unit 54. As for the meaning of the channel here, the channel includes both influences of multipath in the propagation path and time response of a filter (not shown) used at the transmission unit or the reception unit. The terminal A receives a CP control signal at a CP control signal reception unit (symbol number information reception unit) 52, substantially extends the CP size according to an instruction of the CP control signal and transmits the signal whose CP size has been substantially extended from the single carrier transmission unit 51 to the terminal B. The CP control signal includes the size (the number of symbols to be copied (duplicated)) whereby the CP size is substantially extended and corresponds to symbol number information. The CP control signal reception unit 52 corresponds to the symbol number information reception unit.

Instead of the terminal A substantially extending the CP size according to the instruction of the terminal B, it is also possible for the terminal A to substantially extend the CP size spontaneously according to the state of the channel and transmit the information to the terminal B, allowing the terminal B to identify the substantial extension size of the data block transmitted from the terminal A. For example, it is possible to conceive a case where the terminal A and terminal B are carrying out a bidirectional communication based on a TDD (time division duplex) scheme at the same frequency and the terminal A substantially extends the CP size spontaneously according to the state of the channel. In this case, the terminal A may also be equipped with a change unit (not shown) which makes a substantial change (change of the number of symbols to be copied (duplicated)) of the CP size according to the state of the channel.

In the same way, the terminal A may also substantially extend (change) the CP size according to the transmission symbol rate. This is because when the shape (tap coefficient of an FIR filter) of the filter (not shown) used at the transmission unit or reception unit is the same irrespective of the transmission symbol rate, this means that the lower the transmission symbol rate, the longer is the time length of time response of the filter, and the state of the channel including influences of the filter also changes depending on the transmission symbol rate. In such a case, a method of defining the substantial CP size in advance according to the transmission symbol rate in addition to the method of using the above described CP control signal or the method of communicating an extension size may be used.

Figure 16:
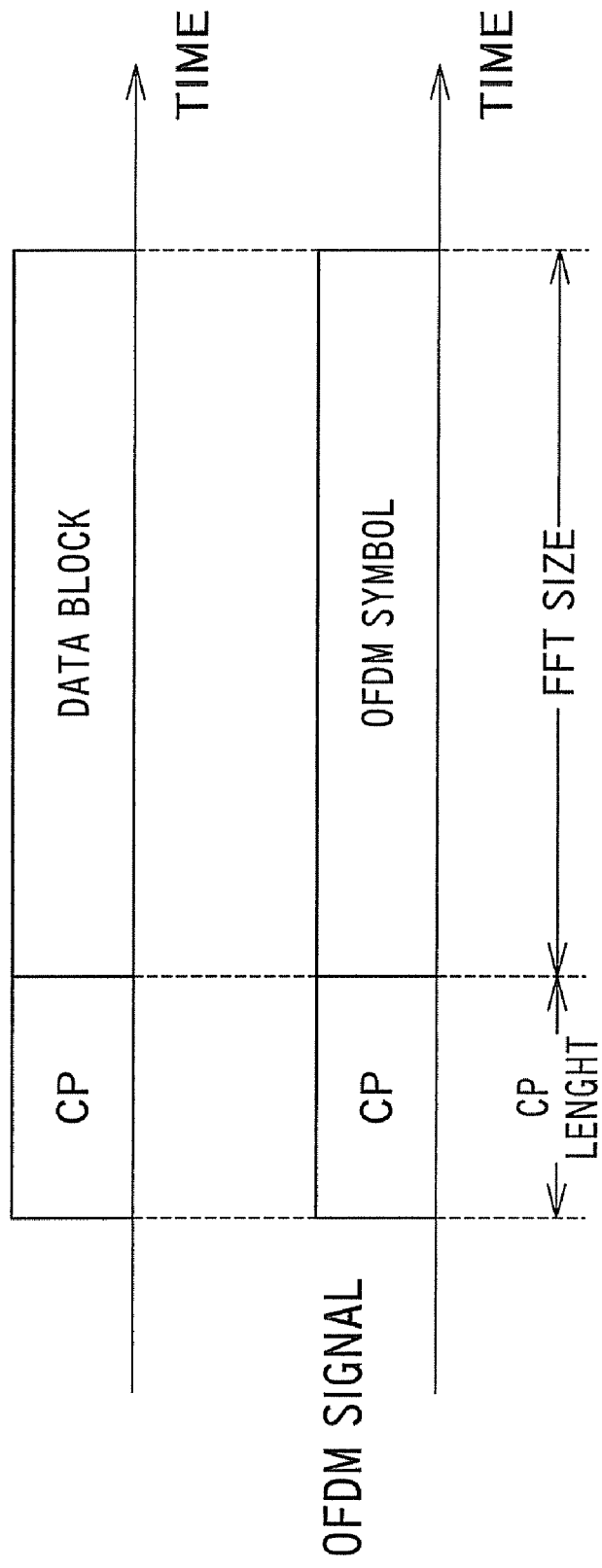
FIG. 16 shows a format configuration example of a signal from the single carrier transmitter according to the first embodiment of the present invention and a signal from an OFDM transmitter.

In this way, the embodiment of the present invention can substantially control the CP size for each terminal without changing the data block size and the CP size added at the CP addition unit. Therefore, it is obvious that the present invention is applicable not only to the one-to-one radio communication system shown in FIG. 15 but also to a one-to-N radio communication system such as a base station and a plurality of mobile terminals. In this case, it is possible to make an OFDM terminal coexist as a mobile terminal in addition to a terminal which has a single carrier transmission unit. However, in the format relationship between a signal from the OFDM terminal and a signal from the single carrier terminal should be such that the CP length is the same and both the OFDM symbol length and the data block length are equal to the FFT size of the receiver as shown in FIG. 16 to maintain the mutually orthogonal relationship. Furthermore, though this embodiment assumes that the symbol rate is constant in the single carrier transmitter, it is obvious that the present invention is also applicable to a one-to-N radio communication system in which the symbol rate varies from one terminal to another if those terminals have the same CP length and the same data block length.

As described above, using the single carrier transmitter according to the embodiment of the present invention makes it possible to substantially extend the length of cyclic prefix without changing the length of the data block and the length of the cyclic prefix added at the CP addition unit. Furthermore, by using the single carrier receiver according to the embodiment of the present invention and combining the same data symbols transmitted in a plurality of data blocks from the single carrier transmitter according to the embodiment of the present invention, it is possible to realize data demodulation with loss due to substantial extension of the cyclic prefix length (CP length) suppressed to a minimum.

What is claimed is:

1. A transmitter comprising:
an input unit configured to input a data symbol sequence;
a block generator configured to sequentially generate data blocks each including a plurality of data symbols by using the data symbol sequence, wherein the block generator is further configured to use, as k data symbols that precede h data symbols at an end of a first data block, a duplicate of k data symbols at an end of a second data block that precedes the first data block, where k and h are integers equal to or greater than one;
an addition unit configured to add a duplicate of the h data symbols at the end of the first data block to a head of the first data block as a cyclic prefix to obtain a first data block with the cyclic prefix; and
a transmission unit configured to transmit the first data block with the cyclic prefix.

2. The transmitter according to claim 1, further comprising:
a coder configured to perform error correction coding on a data bit sequence to obtain a coded data bit sequence;
a puncturing unit configured to perform puncturing processing of puncturing coded data bits from the coded data bit sequence;
an interleaver configured to interleave the coded data bit sequence subjected to the puncturing processing to obtain an interleaved coded data bit sequence; and
a modulator configured to modulate the interleaved coded data bit sequence to obtain the data symbol sequence,
wherein the puncturing unit is further configured to increase a bit number to be punctured from the coded data bit sequence as a value of k increases.

3. The transmitter according to claim 2, wherein:
the puncturing unit is further configured to puncture one or more coded data bits out of a plurality of coded data bits obtained in response to a same state transition occurring in the error correction coding, and
the interleaver is further configured to interleave the coded data bit sequence wherein remaining coded data bits out of the plurality of coded data bits are located at an end.

4. The transmitter according to claim 1, further comprising an information reception unit configured to receive symbol number information indicating a value of k from a receiver as a destination terminal.

5. The transmitter according to claim 1, further comprising a change unit configured to change a value of k according to a channel state or a transmission symbol rate.

6. A transmitter comprising:
an input unit configured to input a data symbol sequence;
a block generator configured to sequentially generate data blocks each including a plurality of data symbols by using the data symbol sequence;
an addition unit configured to add a duplicate of h data symbols at a head of a first data block to an end of the first data block as a cyclic postfix to obtain a first data block with the cyclic postfix, where h is an integer greater than or equal to one; and
a transmission unit configured to transmit the first data block with the cyclic postfix,
wherein the block generator uses, as k data symbols at the end of the first data block, a duplicate of k data symbols from an end of h data symbols at a head of second data block that precedes the first data block toward the head, where k is an integer greater than or equal to one.

7. The transmitter according to claim 6, further comprising:
a coder configured to perform error correction coding on a data bit sequence to obtain a coded data bit sequence;
a puncturing unit configured to perform puncturing processing of puncturing coded data bits from the coded data bit sequence;

an interleaver configured to interleave the coded data bit sequence subjected to the puncturing processing to obtain an interleaved coded data bit sequence; and a modulator configured to modulate the interleaved coded data bit sequence to obtain the data symbol sequence, wherein the puncturing unit is further configured to increase a bit number to be punctured from the coded data bit sequence as a value of k increases.

8. The transmitter according to claim 7, wherein:
the puncturing unit is further configured to puncture one or more coded data bits out of a plurality of coded data bits obtained in response to a same state transition occurring in the error correction coding, and the interleaver is further configured to interleave the coded data bit sequence wherein remaining coded data bits out of the plurality of coded data bits are located at an end.

9. The transmitter according to claim 6, further comprising an information reception unit configured to receive symbol number information indicating a value of k from a receiver as a destination terminal.

10. The transmitter according to claim 6, further comprising a change unit configured to change a value of k according to a channel state or a transmission symbol rate.

11. A transmitter comprising:
an input unit configured to input a data symbol sequence;
a block generator configured to sequentially generate data blocks each including a plurality of data symbols by using the data symbol sequence;
an addition unit configured to add a duplicate of h data symbols at an end of a first data block to a head of the first data block as a cyclic prefix to obtain a first data block with the cyclic prefix, where h is an integer equal to or greater than one; and
a transmission unit configured to transmit the first data block with the cyclic prefix,
wherein the block generator uses, as k data symbols at the end of the first data block, a duplicate of k data symbols that precede h data symbols at an end of a third data block that follows the first data block, where k is an integer greater than or equal to one.

12. The transmitter according to claim 11, further comprising:
a coder configured to perform error correction coding on a data bit sequence to obtain a coded data bit sequence;
a puncturing unit configured to perform puncturing processing of puncturing coded data bits from the coded data bit sequence;
an interleaver configured to interleave the coded data bit sequence subjected to the puncturing processing to obtain an interleaved coded data bit sequence; and
a modulator configured to modulate the interleaved coded data bit sequence to obtain the data symbol sequence,
wherein the puncturing unit is further configured to increase a bit number to be punctured from the coded data bit sequence as a value of k increases.

13. The transmitter according to claim 12, wherein:
the puncturing unit is further configured to puncture one or more coded data bits out of a plurality of coded data bits obtained in response to occurrence of a same state transition in the error correction coding, and
the interleaver is further configured to interleave the coded data bit sequence so that remaining coded data bits out of the plurality of coded data bits are located at an end.

14. The transmitter according to claim 11, further comprising an information reception unit configured to receive symbol number information indicating a value of k from a receiver as a destination terminal.

15. The transmitter according to claim 11, further comprising a change unit configured to change a value of k according to a channel state or a transmission symbol rate.

16. A transmitter comprising:
an input unit configured to input a data symbol sequence;
a block generator configured to sequentially generate data blocks each including a plurality of data symbols by using the data symbol sequence;
an addition unit configured to add a duplicate of h data symbols at a head of a first data block to an end of the first data block as a cyclic postfix to obtain a first data block with the cyclic postfix, where h is an integer equal to or greater than one; and
a transmission unit configured to transmit the first data block with the cyclic postfix,
wherein the block generator uses, as k data symbols from the end of the h data symbols at the head of the first data block toward the head, a duplicate of k data symbols at an end of a third data block that follows the first data block, where k is an integer greater than or equal to one.

17. The transmitter according to claim 16, further comprising:
a coder configured to perform error correction coding on a data bit sequence to obtain a coded data bit sequence;
a puncturing unit configured to perform puncturing processing of puncturing coded data bits from the coded data bit sequence;
an interleaver configured to interleave the coded data bit sequence subjected to the puncturing processing to obtain an interleaved coded data bit sequence; and
a modulator configured to modulate the interleaved coded data bit sequence to obtain the data symbol sequence,
wherein the puncturing unit is further configured to increase a bit number to be punctured from the coded data bit sequence as a value of the k increases.

18. The transmitter according to claim 17, wherein:
the puncturing unit is further configured to puncture one or more coded data bits out of a plurality of coded data bits obtained in response to occurrence of a same state transition in the error correction coding, and
the interleaver is further configured to interleave the coded data bit sequence wherein remaining coded data bits out of the plurality of coded data bits are located at an end.

19. The transmitter according to claim 16, further comprising a information reception unit configured to receive symbol number information indicating a value of k from a receiver as a destination terminal.

20. The transmitter according to claim 16, further comprising a change unit configured to change a value of k according to a channel state or a transmission symbol rate.

21. A receiver comprising:
a reception unit configured to sequentially receive a first data block and a second data block with each cyclic prefix or cyclic postfix, the first data block and the second data block each including a plurality of data symbols, the cyclic prefix of the first data block being a duplicate of h data symbols at an end of the first data block and added to a head of the first data block, the cyclic prefix of the second data block being a duplicate of h data symbols at an end of the second data block and added to a head of the second data block, the cyclic postfix of the first data block being a duplicate of h data symbols at the head of the first data block and added to the end of the first data block, and the cyclic postfix of the second data block being a duplicate of h data symbols at the head of the second data block and added to the end of the second data block, wherein as k data symbols that precede the h data symbols at the end of the second data block with cyclic prefix, a duplicate of k data symbols at the end of the first data block with cyclic prefix is used, or as k data symbols at the end of the second data block with cyclic postfix, a duplicate of k data symbols headward from the end of h data symbols at the head of the first data block with cyclic postfix is used, where k and h are integers greater than or equal to one;

a removing unit configured to remove the cyclic prefix or cyclic postfix from the first data block and the second data block with each cyclic prefix or cyclic postfix and thereby extract the first data block and the second data block;

a fast Fourier transform (FFT) processing unit configured to perform a fast Fourier transform on the first data block and the second data block to decompose each of the first data block and the second data block into a plurality of frequency components;

an equalization processing unit configured to perform equalization processing on signals of the plurality of frequency components into which the first data block and the second data block are decomposed, respectively;

an Inverse Fast Fourier Transform (IFFT) processing unit configured to perform Inverse Fast Fourier Transform processing on the signals of the plurality of frequency components subjected to each equalization processing to obtain a first received data block and a second received data block each including a plurality of received data symbols; and a combining unit configured to combine k received data symbols at an end of the first received data block and k received data symbols that precede h data symbols at an end of the second received data block, to obtain k combined data symbols to be used instead of the k received data symbols at the end of the first received data block, or k received data symbols headward from an end of h data symbols at a head of the first received data block and k received data symbols at the end of the second received data block, to obtain k combined data symbols to be used instead of the k received data symbols at the end of the first received data block.

22. A receiver comprising:

a reception unit configured to sequentially receive a first data block and a second data block with each cyclic prefix or cyclic postfix, the first data block and the second data block each including a plurality of data symbols, the cyclic prefix of the first data block being a duplicate of h data symbols at an end of the first data block and added to a head of the first data block, the cyclic prefix of the second data block being a duplicate of h data symbols at an end of the second data block and added to a head of the second data block, the cyclic postfix of the first data block being a duplicate of h data symbols at the head of the first data block and added to the end of the first data block, and the cyclic postfix of the second data block being a duplicate of h data symbols at the head of the second data block and added to the end of the second data block, wherein as k data symbols that precede the h data symbols at the end of the second data block with cyclic prefix, a duplicate of k data symbols at the end of the first data block with cyclic prefix is used, or as k data symbols at the end of the second data block with cyclic postfix, a duplicate of k data symbols headward from the end of h data symbols at the head of the first data block with cyclic posffix;

a removing unit configured to remove the cyclic prefix or cyclic postfix from the first data block and the second data block with each cyclic prefix or cyclic postfix and thereby extract the first data block and the second data block;

a fast Fourier transform (FFT) processing unit configured to perform a fast Fourier transform on the first data block and the second data block to decompose each of the first data block and the second data block into a plurality of frequency components;

an equalization processing unit configured to perform equalization processing on signals of the plurality of frequency components into which the first data block and the second data block are decomposed, respectively;

an Inverse Fast Fourier Transform (IFFT) processing unit configured to perform Inverse Fast Fourier Transform processing on the signals of the plurality of frequency components subjected to each equalization processing to obtain a first received data block and a second received data block each including a plurality of received data symbols; and a bit likelihood generator configured to generate bit likelihood data for the received data symbols in the first received data block and bit likelihood data for the received data symbols in the second received data block; and a combining unit configured to combine first bit likelihood data and second bit likelihood data to obtain third bit likelihood data to be used instead of the first bit likelihood data, wherein the first bit likelihood data is bit likelihood data generated for k received data symbols at the end of the first received data block and the second bit likelihood data is bit likelihood data generated for k received data symbols that precede h received data symbols in the end of the second received data block, or the first bit likelihood data is bit likelihood data generated for k received data symbols headward from an end of h data symbols at a head of the first received data block and the second bit likelihood data is bit likelihood data generated for k received data symbols at the end of the second received data block.

* * * * *